United States Patent
Kumano et al.

(10) Patent No.: US 11,210,163 B2
(45) Date of Patent: Dec. 28, 2021

(54) MEMORY SYSTEM AND CONTROL METHOD

(71) Applicant: TOSHIBA MEMORY CORPORATION, Tokyo (JP)

(72) Inventors: Yuta Kumano, Kanagawa (JP); Hironori Uchikawa, Kanagawa (JP); Kosuke Morinaga, Kanagawa (JP); Naoaki Kokubun, Kanagawa (JP); Masahiro Kiyooka, Kanagawa (JP); Yoshiki Notani, Kanagawa (JP); Kenji Sakurada, Kanagawa (JP); Daiki Watanabe, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 104 days.

(21) Appl. No.: 16/681,107

(22) Filed: Nov. 12, 2019

(65) Prior Publication Data
US 2020/0081770 A1     Mar. 12, 2020

Related U.S. Application Data

(63) Continuation-in-part of application No. 16/127,965, filed on Sep. 11, 2018, now abandoned.

(30) Foreign Application Priority Data

Jan. 16, 2018   (JP) .............................. JP2018-005143

(51) Int. Cl.
*G11C 29/00*     (2006.01)
*G06F 11/10*     (2006.01)
(Continued)

(52) U.S. Cl.
CPC ...... *G06F 11/1048* (2013.01); *G06F 11/1012* (2013.01); *G06F 11/1044* (2013.01);
(Continued)

(58) Field of Classification Search
CPC ............. G06F 11/1044; G06F 11/1012; G06F 11/1048; G06F 11/1068; G11C 11/5642;
(Continued)

(56) References Cited

U.S. PATENT DOCUMENTS 6,421,804 B1 * 7/2002 Lee .................... H03M 13/2963
                                                           714/755
7,447,280 B2 * 11/2008 Turin ................ H03M 13/3746
                                                           375/262
(Continued)

FOREIGN PATENT DOCUMENTS

EP      2 763 042 A1    8/2014
JP      2010-109468     5/2010
(Continued)

*Primary Examiner* — Albert Decady
*Assistant Examiner* — Enamul M Kabir
(74) *Attorney, Agent, or Firm* — Oblon, McClelland, Maier & Neustadt, L.L.P.

(57) ABSTRACT

According to one embodiment, a memory system includes a non-volatile memory, a memory interface that reads data recorded in the non-volatile memory as a received value, a converting unit that converts the received value to first likelihood information by using a first conversion table, a decoder that decodes the first likelihood information, a control unit that outputs an estimated value with respect to the received value, which is a decoding result obtained by the decoding, when decoding by the decoder has succeeded, and a generating unit that generates a second conversion table based on a decoding result obtained by the decoding, when decoding of the first likelihood information by the decoder has failed. When the generating unit generates the second conversion table, the converting unit converts the received value to the second likelihood information by using the second conversion table, and the decoder decodes the second likelihood information.

18 Claims, 12 Drawing Sheets

(51) Int. Cl.
*G11C 11/56* (2006.01)
*H03M 13/00* (2006.01)
*H03M 13/37* (2006.01)
*G11C 29/52* (2006.01)
*H03M 13/11* (2006.01)
*G11C 29/04* (2006.01)
*G11C 16/26* (2006.01)
*G11C 29/42* (2006.01)

(52) U.S. Cl.
CPC ...... *G06F 11/1068* (2013.01); *G11C 11/5642* (2013.01); *G11C 29/52* (2013.01); *H03M 13/3715* (2013.01); *H03M 13/3746* (2013.01); *H03M 13/6325* (2013.01); *G11C 16/26* (2013.01); *G11C 29/42* (2013.01); *G11C 2029/0409* (2013.01); *G11C 2029/0411* (2013.01); *H03M 13/1108* (2013.01); *H03M 13/1111* (2013.01)

(58) Field of Classification Search
CPC ......... G11C 16/26; G11C 29/42; G11C 29/52; G11C 2029/0409; G11C 2029/0411; H03M 13/1108; H03M 13/1111; H03M 13/3715; H03M 13/3746; H03M 13/6325
See application file for complete search history.

(56) References Cited

U.S. PATENT DOCUMENTS

| | | | |
|---|---|---|---|
| 9,183,083 B2 | 11/2015 | Sakurada et al. | |
| 9,563,502 B1* | 2/2017 | Alhussien | G06F 11/1048 |
| 10,276,247 B2* | 4/2019 | Alhussien | H03M 13/6325 |
| 2008/0244367 A1* | 10/2008 | Chin | G06F 12/0246 |
| | | | 714/800 |
| 2011/0083060 A1* | 4/2011 | Sakurada | G11C 16/26 |
| | | | 714/763 |
| 2011/0239092 A1* | 9/2011 | Horisaki | G06F 11/1048 |
| | | | 714/773 |
| 2014/0013190 A1* | 1/2014 | Bao | H03M 13/658 |
| | | | 714/780 |
| 2014/0153625 A1* | 6/2014 | Vojcic | G06F 11/1625 |
| | | | 375/224 |
| 2015/0149871 A1* | 5/2015 | Chen | G11C 29/021 |
| | | | 714/773 |
| 2015/0188577 A1 | 7/2015 | Ogawa et al. | |
| 2015/0200688 A1* | 7/2015 | Pan | G06F 11/1012 |
| | | | 714/794 |
| 2016/0055055 A1* | 2/2016 | Harada | H03M 13/6325 |
| | | | 714/764 |
| 2016/0093396 A1* | 3/2016 | Alhussien | G11C 29/026 |
| | | | 365/185.21 |
| 2016/0246603 A1* | 8/2016 | Watanabe | G06F 9/3001 |
| 2016/0266968 A1* | 9/2016 | Torii | G06F 11/1012 |
| 2016/0266969 A1* | 9/2016 | Jeon | G11C 11/5642 |
| 2016/0266972 A1* | 9/2016 | Yamaki | H03M 13/3746 |
| 2016/0336966 A1* | 11/2016 | Anderson | H03M 13/6591 |
| 2017/0068593 A1* | 3/2017 | Yoshinaga | G11C 29/52 |
| 2017/0125114 A1 | 5/2017 | Alhussien et al. | |
| 2017/0257122 A1* | 9/2017 | Torii | H03M 13/3707 |
| 2018/0032396 A1* | 2/2018 | Sharon | G06F 3/064 |
| 2018/0074894 A1 | 3/2018 | Sakurada | |

FOREIGN PATENT DOCUMENTS

| | | |
|---|---|---|
| JP | 2014-150528 A | 8/2014 |
| JP | 2016-208309 | 12/2016 |

* cited by examiner

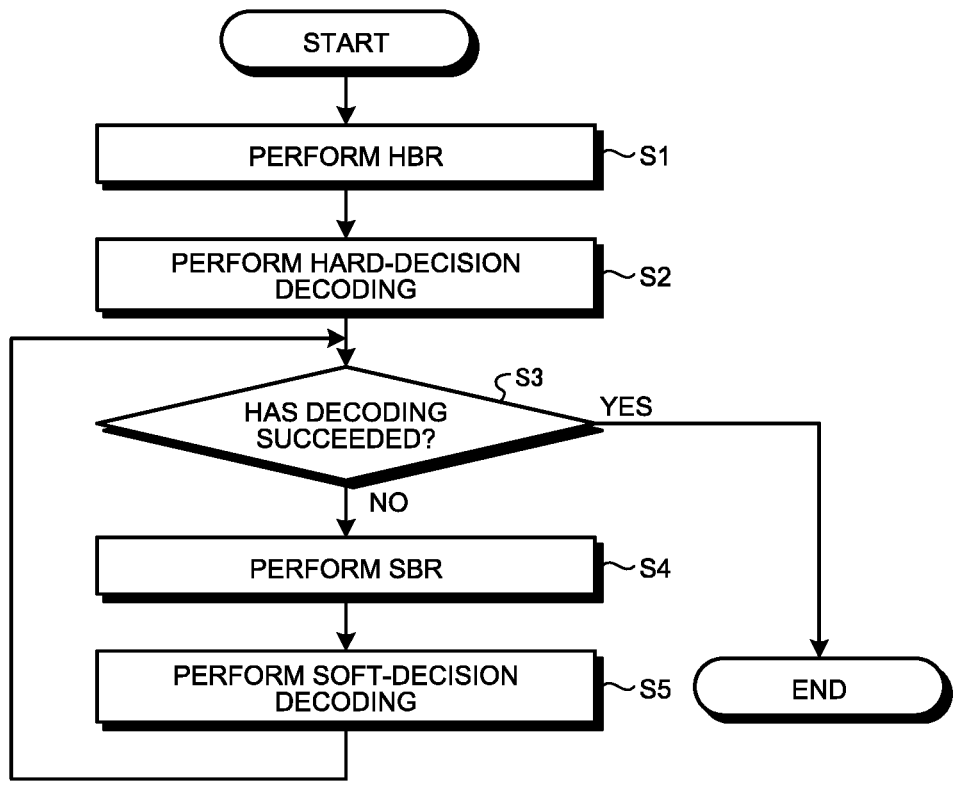
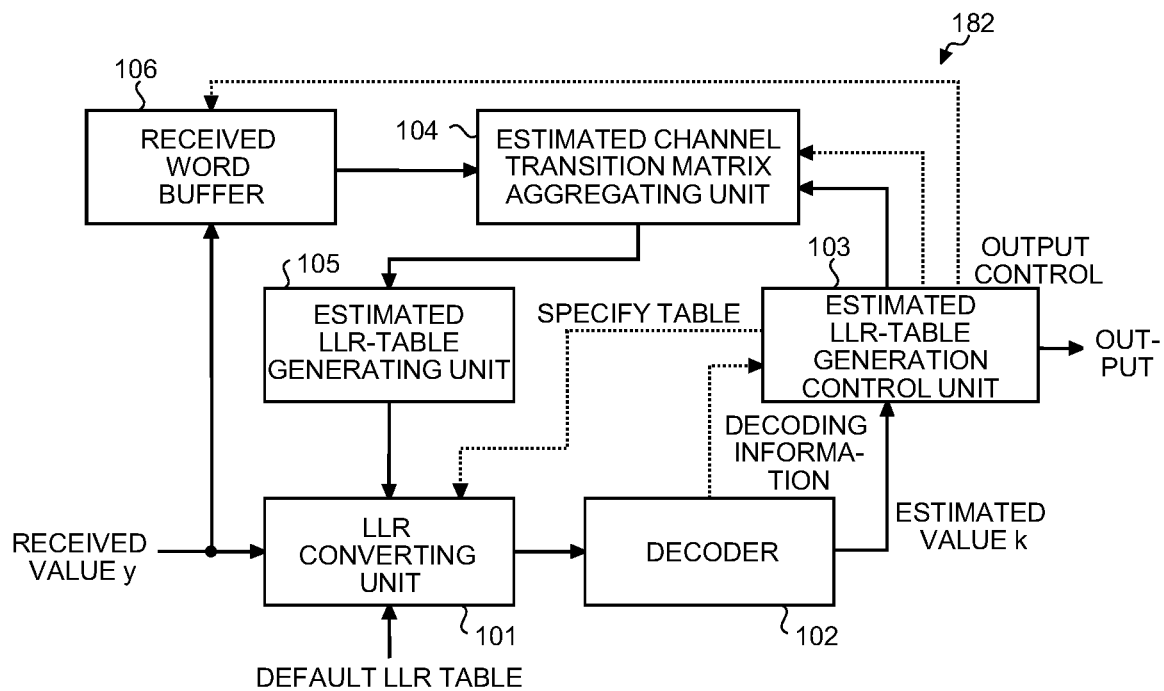

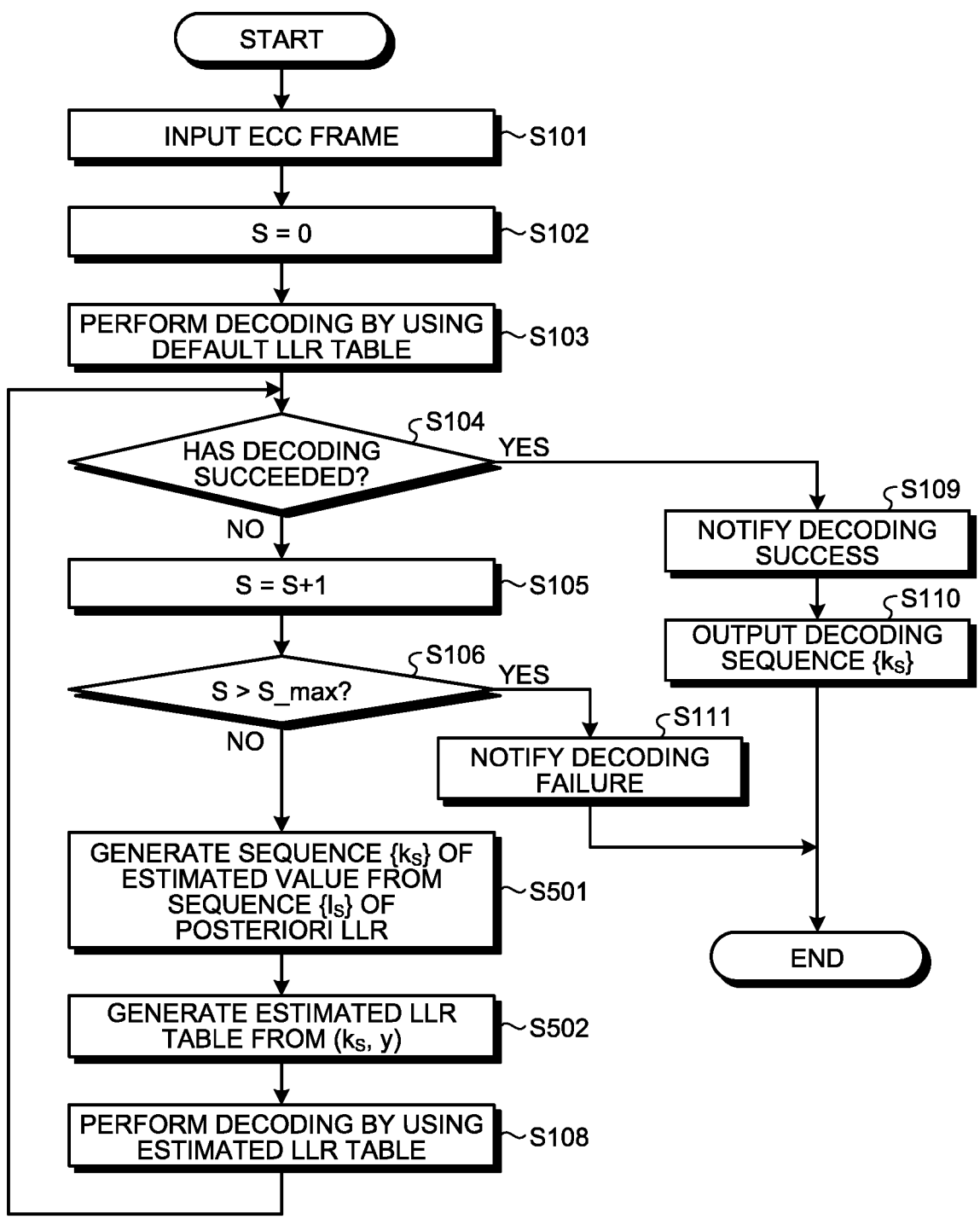

MEMORY SYSTEM AND CONTROL METHOD

CROSS-REFERENCE TO RELATED APPLICATIONS

This application is a continuation-in-part application of application Ser. No. 16/127,965 filed on Sep. 11, 2018, which claims the benefit of priority from Japanese Patent Application No. 2018-005143 filed on Jan. 16, 2018; the entire contents of all of which are incorporated herein by reference.

FIELD

Embodiments described herein relate generally to a memory system and a control method.

BACKGROUND

In a memory system including a non-volatile memory such as a flash memory, data to be written in the non-volatile memory is generally encoded in terms of data protection. Therefore, at the time of reading data memorized in the memory system, decoding is performed with respect to the encoded data.

As a read method of data recorded in a non-volatile memory, there are, for example, hard-decision read (also referred to as "hard bit read") and soft-decision read (also referred to as "soft bit read"). In the hard-decision read when each memory cell of a non-volatile memory is a single level cell (SLC) that stores 1-bit data, data recorded in each memory cell is read as a "0" or "1" bit value. Meanwhile, in the soft-decision read with respect to an SLC, recorded data is read as information regarding probability of whether the data is "0" or "1". For the information regarding probability, a log-likelihood ratio (LLR) is generally used. The LLR is information in which probability of the recorded bit being "0" and probability of the recorded bit being "1" are expressed by a log ratio. In the soft-decision read, data read from the non-volatile memory is converted to a LLR according to a table referred to as "LLR table" generated beforehand and is decoded.

BRIEF DESCRIPTION OF THE DRAWINGS

FIG. 3 is a flowchart illustrating an example of data read processing according to the first embodiment;

FIG. 4 is a block diagram illustrating a more detailed configuration example of a soft-decision decoding unit according to the first embodiment;

FIG. 18 is a flowchart illustrating a schematic example of a decoding operation according to the fifth embodiment.

DETAILED DESCRIPTION

Figure 1:
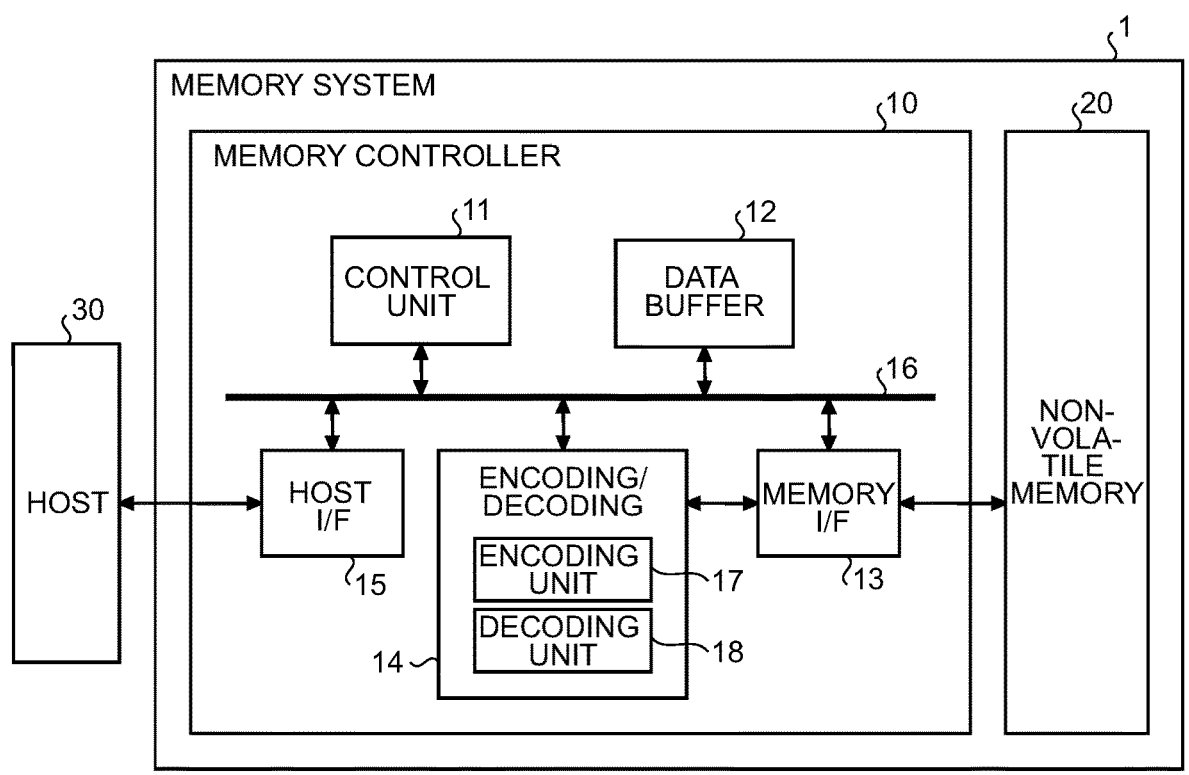
FIG. 1 is a block diagram illustrating a schematic configuration example of a memory system according to a first embodiment.

In general, according to one embodiment, a memory system includes a non-volatile memory, a memory interface that reads data recorded in the non-volatile memory as a received value, a converting unit that converts the received value read from the non-volatile memory to first likelihood information by using a first conversion table, a decoder that decodes the first likelihood information, a control unit that outputs an estimated value with respect to the received value, which is a decoding result obtained by the decoding, when decoding by the decoder has succeeded, and a generating unit that generates a second conversion table based on a decoding result obtained by the decoding, when decoding of the first likelihood information by the decoder has failed, wherein when the generating unit generates the second conversion table, the converting unit converts the received value to second likelihood information by using the second conversion table, and the decoder decodes the second likelihood information.

Exemplary embodiments of a memory system and a control method will be explained below in detail with reference to the accompanying drawings. The present invention is not limited to the following embodiments.

For explanation of embodiments, terms are defined as described below.

"Communication channel (hereinafter, also "channel" or "stress")" is a probability model representing an impact of noise to a write value (hereinafter, also "transmitted value") x and is characterized by a channel transition matrix. As factors characterizing the channel transition matrix, so-called program disturb, data retention, read disturb, and temperature crossover can be considered.

"Likelihood" is a conditional probability $P(y|x)$ of being able to obtain an output value (hereinafter, also "received value") y of a channel, when a certain write value x is provided.

"Channel transition matrix" is a matrix in which likelihood is described regarding all pairs of (x, y).

"Log-likelihood ratio (LLR)" is information in which likelihood of a recorded bit being "0" and likelihood of a recorded bit being "1" are expressed by a log ratio as described above and is also referred to as "likelihood information".

"LLR table" is a table indicating a correspondence relation between an output value y of a channel and an LLR being an input to a decoder. Therefore, a value ln [P(y|x=0)/P(y|x=1)] obtained from a channel transition matrix becomes an LLR value corresponding to the output value y. Generally, a different LLR table is prepared with respect to a different channel transition matrix.

"Default LLR table" is an LLR table to be used by default. An LLR table obtained from a channel that may be typically used, for example, when correction is assumed in various channels is used as the default LLR table.

"ECC frame" is a data block for a decoder to operate and is a data block for reconfiguring a code word from a sequence of received values.

"Estimated write value (hereinafter, also "estimated value") k of a decoding result" is every single estimated write value, which is an output of a decoder. Therefore, at the end of decoding, a sequence {k} of an estimated write value k corresponding to an ECC frame is obtained. Success in decoding means that a sequence {x} of answers completely match a sequence {k} of a decoding result. On the other hand, failure in decoding means that there is a part being x≠k in the ECC frame and the sequence {x} and the sequence {k} do not match each other. In order to know the true success and failure of decoding, it is necessary to know the sequence of answers. Because the decoder does not know the sequence of answers, the decoder does not know true success and failure, but the decoder has estimated information of success and failure of decoding. In the following context describing decoding, when success and failure of decoding is simply referred to, it means the success and failure of decoding estimated by the decoder.

"True channel transition matrix" is a channel transition matrix including the conditional probability P(y|x) based on x being a correct answer as an element. Meanwhile, "estimated channel transition matrix" is a channel transition matrix including the conditional probability P(y|k) using the estimated write value k output from a decoder as an element.

"Estimated LLR table" is an LLR table based on an estimated channel transition matrix.

First Embodiment

First, a memory system and a control method according to a first embodiment is described in detail with reference to the drawings. FIG. 1 is a block diagram illustrating a schematic configuration example of the memory system according to the first embodiment. As illustrated in FIG. 1, a memory system 1 includes a memory controller 10 and a non-volatile memory 20. The memory system 1 can be connected to a host 30, and FIG. 1 illustrates a state in which the memory system 1 is connected to the host 30. The host 30 can be an electronic device such as a personal computer or a mobile terminal.

The non-volatile memory 20 is a non-volatile memory that memorizes data in a non-volatile manner and is, for example, a NAND flash memory (hereinafter, simply "NAND memory"). In the following descriptions, a case in which a NAND memory is used as the non-volatile memory 20 is exemplified. However, a storage device other than the NAND memory such as a three-dimensional structure flash memory, a ReRAM (Resistive Random Access Memory), and an FeRAM (Ferroelectric Random Access Memory) can be used as the non-volatile memory 20. Further, it is not essential that the non-volatile memory 20 is a semiconductor memory and the present embodiment can be applied to various storage media other than the semiconductor memory.

The memory system 1 can be various memory systems including the non-volatile memory 20, such as a so-called SSD (Solid State Drive), and a memory card in which the memory controller 10 and the non-volatile memory 20 are configured as one package.

The memory controller 10 controls write to the non-volatile memory 20 in response to a write request from the host 30. The memory controller 10 also controls read from the non-volatile memory 20 in response to a read request from the host 30. The memory controller 10 is a semiconductor integrated circuit configured as, for example, an SoC (System On a Chip). The memory controller 10 includes a host I/F (host interface) 15, a memory I/F (memory interface) 13, a control unit 11, an encoding/decoding unit (codec) 14, and a data buffer 12. The host I/F 15, the memory I/F 13, the control unit 11, the encoding/decoding unit 14, and the data buffer 12 are connected to each other by an internal bus 16. A part or all of operations of respective constituent elements of the memory controller 10 described below can be realized by executing firmware by a CPU (Central Processing Unit) or by hardware.

The host I/F 15 performs processing according to interface standards between the host 30 and the host I/F 15 and outputs a command received from the host 30 and user data to be written to the internal bus 16. The host I/F 15 transmits user data read from the non-volatile memory 20 and restored and a response from the control unit 11 to the host 30.

The memory I/F 13 performs write processing with respect to the non-volatile memory 20 based on an instruction from the control unit 11. The memory I/F 13 also performs read processing from the non-volatile memory 20 based on an instruction from the control unit 11.

The control unit 11 integrally controls the respective constituent elements of the memory system 1. Upon reception of a command from the host 30 via the host I/F 15, the control unit 11 executes control according to the command. For example, the control unit 11 instructs the memory I/F 13 to write user data and parity in the non-volatile memory 20 according to a command from the host 30. Further, the control unit 11 instructs the memory I/F 13 to read user data and parity from the non-volatile memory 20 according to a command from the host 30.

Upon reception of a write request from the host 30, the control unit 11 determines a storage area (memory area) on the non-volatile memory 20 with respect to user data accumulated in the data buffer 12. That is, the control unit 11 manages a write destination of user data. Association between a logical address of user data received from the host 30 and a physical address indicating a storage area on the non-volatile memory 20 in which the user data is stored is stored as an address conversion table.

Upon reception of a read request from the host 30, the control unit 11 converts a logical address specified by the read request to a physical address by using the address conversion table described above and instructs the memory I/F 13 to read user data from the physical address.

In the NAND memory, write and read are generally performed in the unit of data referred to as "page" and erasure is performed in the unit of data referred to as "block". In the present embodiment, a plurality of memory cells connected to the same word line are referred to as "memory cell group". When the memory cell is a single level cell (SLC), one memory cell group corresponds to one page. When the memory cell is a multiple level cell (MLC), one memory cell group corresponds to a plurality of pages. In the present explanation, the MLC includes a TLC (Triple Level Cell), a QLC (Quad Level Cell), and the like. The respective memory cells are connected to the word line and also to a bit line. Therefore, the respective memory cells can be identified by an address identifying the word line and an address identifying the bit line.

The data buffer 12 temporarily stores therein user data received from the host 30 by the memory controller 10 until the user data is memorized in the non-volatile memory 20. Further, the data buffer 12 temporarily stores therein user data read from the non-volatile memory 20 until the user data is transmitted to the host 30. As the data buffer 12, for example, a general-purpose memory such as an SRAM (Static Random Access Memory) and a DRAM (Dynamic Random Access Memory) can be used. The data buffer 12 can be mounted on the outside of the memory controller 10 without being incorporated in the memory controller 10.

User data transmitted from the host 30 is transferred by the internal bus 16 and is temporarily stored in the data buffer 12. The encoding/decoding unit 14 encodes user data stored in the non-volatile memory 20 to generate a code word. The encoding/decoding unit 14 also decodes a received word read from the non-volatile memory 20 to restore the user data. Therefore, the encoding/decoding unit 14 includes an encoding unit (encoder) 17 and a decoding unit (decoder) 18. Data to be encoded by the encoding/decoding unit 14 can include control data or the like to be used in the memory controller 10, other than the user data.

Write processing according to the present embodiment is described next. The control unit 11 instructs the encoding unit 17 to encode user data at the time of write to the non-volatile memory 20. At that time, the control unit 11 determines a storage place (storage address) of a code word in the non-volatile memory 20 and instructs the determined storage place to the memory I/F 13.

The encoding unit 17 generates a code word by encoding user data on the data buffer 12 based on an instruction from the control unit 11. As the encoding method, as described below, for example, an encoding method using an algebraic code such as a BCH (Bose-Chaudhuri-Hocquenghem) code or a RS (Reed-Solomon) code, or an encoding method using a code based on a sparse graph such as a LDPC (Low-Density Parity-Check) code can be employed. The memory I/F 13 executes control to store a code word in the storage place on the non-volatile memory 20 instructed by the control unit 11.

Processing at the time of read from the non-volatile memory 20 according to the present embodiment is described next. At the time of read from the non-volatile memory 20, the control unit instructs the memory I/F 13 to perform read by specifying an address on the non-volatile memory 20. The control unit 11 also instructs the decoding unit 18 to start decoding. The memory I/F 13 reads a received word from the specified address on the non-volatile memory 20 according to the instruction from the control unit 11 and inputs the read received word to the decoding unit 18. The decoding unit 18 decodes the received word read from the non-volatile memory 20.

Figure 2:
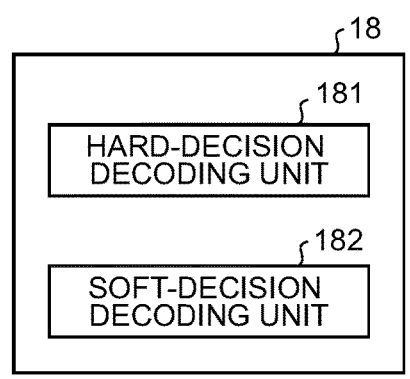
FIG. 2 is a block diagram illustrating a configuration example of a decoding unit according to the first embodiment.

The decoding unit 18 decodes the received word read from the non-volatile memory 20. FIG. 2 is a block diagram illustrating a configuration example of the decoding unit according to the present embodiment. As illustrated in FIG. 2, the decoding unit 18 includes a hard-decision decoding unit 181 that performs hard-decision decoding in which upon input of a hard-decision value, the hard-decision value as a result thereof is output, and a soft-decision decoding unit 182 that performs soft-decision decoding in which upon input of a soft-decision value, the soft-decision value as a result thereof is output. Generally, the soft-decision decoding has a feature such that although error correction capacity is higher than that of the hard-decision decoding, processing time is longer than that of the hard-decision decoding. Therefore, such a configuration that, for example, the hard-decision decoding unit 181 first performs hard-decision decoding, and if the decoding fails, the soft-decision decoding unit 182 performs soft-decision decoding can be used. However, the present embodiment is not limited to such a configuration and, for example, the hard-decision decoding unit 181 can be omitted.

FIG. 3 is a flowchart illustrating an example of data read processing according to the first embodiment. The control unit 11 instructs the memory I/F 13 to read data from the non-volatile memory 20 by hard bit read (HBR) by specifying a read address, and in response thereto, the memory I/F 13 performs hard bit read (Step S1). The hard bit read is a read method in which each bit constituting data to be read is read as a received word having a hard-decision value of 0 or 1. The read received word having a hard-decision value is input to the decoding unit 18 of the encoding/decoding unit 14, for example, via the internal bus 16.

When the non-volatile memory 20 is a NAND memory, at the time of data write, electrons are injected so that the number of electrons (charge amount) at a floating gate corresponds to any of a plurality of distributions (threshold distributions), depending on a write value x. To simplify the explanations here, an example of a single level cell (SLC) in which one memory cell memorizes one bit is described. In a case of an SLC, either one of two distributions corresponds to 0 and the other corresponds to 1. When a voltage is applied to the memory cell, if a voltage equal to or higher than a voltage value corresponding to the charge amount of the memory cell is applied, a current flows, and if a voltage lower than the voltage value is applied, a current does not flow. Therefore, a voltage which starts to make the current flow is determined depending on the charge amount of the memory cell for each memory cell. Here, the voltage value determined depending on the charge amount of the memory cell is referred to as "threshold voltage". In an initial state, charge is injected so as to correspond to either one of the two threshold voltage distributions, and at the time of read, by applying a reference read voltage (hereinafter, also "reference read level") that marks the boundary between the two threshold voltage distributions, it can be decided whether data memorized in the memory cell is 1 or 0.

In hard bit read, the reference read voltage is applied to the memory cell to decide whether data memorized in the memory cell is 1 or 0, and a decided result is output as a received value y. The read voltage to be applied at the time of hard bit read may be changed from the reference read voltage.

Returning to the explanation in FIG. 3, the control unit 11 instructs the decoding unit 18 to perform hard-decision decoding, and in response thereto, the hard-decision decoding unit 181 of the decoding unit 18 performs hard-decision decoding with respect to the received word (Step S2). Specifically, the hard-decision decoding unit 181 performs decoding, for example, bounded distance decoding with respect to the received word. However, the hard-decision decoding performed by the hard-decision decoding unit 181 is not limited to the bounded distance decoding and can be any hard-decision decoding.

After Step S2, the hard-decision decoding unit 181 determines whether decoding has succeeded and notifies the determination result to the control unit 11. The control unit 11 determines whether decoding has succeeded based on the notification from the hard-decision decoding unit 181 (Step S3). If decoding has succeeded (YES at Step S3), the read processing ends.

On the other hand, if decoding has failed (NO at Step S3), the control unit 11 instructs the memory I/F 13 to read data from the non-volatile memory 20 by soft bit read (SBR) by specifying a read address. In response thereto, the memory I/F 13 performs soft bit read in which data held by the respective memory cells are read by applying more than one read voltages (Step S4). The read received value y is input to the decoding unit 18 of the encoding/decoding unit 14 via the internal bus 16, for example, as a sequence {y} per ECC frame.

At Step S5, the control unit 11 instructs the decoding unit 18 to perform soft-decision decoding. In response thereto, the soft-decision decoding unit 182 of the decoding unit 18 performs soft-decision decoding with respect to the sequence {y} of the received value y input per ECC frame (Step S5). Thereafter, the operation returns to Step S3. Details of the soft-decision decoding according to the present embodiment are described next.

Soft decision decoding according to the present embodiment is described next in detail. First, a relation between "estimation of a channel necessary for soft-decision decoding" and an "LLR table" is described. In order to simplify the following descriptions, a value that a transmitted value x can take is designated as 0 and 1, and a value that a received value y can take is designated as 0, 1, 2, and 3.

For the soft-decision decoding, when a channel to be decoded is determined, the transmitted value x to be written in the non-volatile memory 20 is recorded, and the transition from the transmitted value x read from the non-volatile memory 20 to the received value y is also recorded. Therefore, in the present explanation, it is assumed that a histogram as illustrated in Table 1 described below is obtained.

TABLE 1

|       | y = 0 | y = 1 | y = 2 | y = 3 |
|-------|-------|-------|-------|-------|
| x = 0 | 1     | 125   | 729   | 2197  |
| x = 1 | 3375  | 1331  | 343   | 27    |

In Table 1, as a result of 8128 observations, it is indicated that a pair of (x=0, y=0) is observed once, a pair of (x=1, y=0) is observed 3375 times, a pair of (x=0, y=1) is observed 125 times, a pair of (x=1, y=1) is observed 1331 times, a pair of (x=0, y=2) is observed 729 times, a pair of (x=1, y=2) is observed 343 times, a pair of (x=0, y=3) is observed 2197 times, and a pair of (x=1, y=3) is observed 27 times.

A conditional probability P(y|x) of a true channel is estimated as described below based on Table 1. That is, if it is assumed that the number of observations (hereinafter, also "frequency") of each pair of (x, y) is F(x, y), a conditional probability P(y=0|x=0) of observing, for example, a pair of (x=0, y=0) is obtained as represented by the following equation (1), and a conditional probability P of observing a pair of (x=1, y=0) is obtained as represented by the following equation (2).

[Equation 1]
$$P(y=0 \mid x=0) = \frac{F(x=0, y=0)}{\sum_{y'} F(x=0, y')} = \frac{1}{3052} \quad (1)$$

[Equation 2]
$$P(y=0 \mid x=1) = \frac{F(x=1, y=0)}{\sum_{y'} F(x=1, y')} = \frac{3375}{5076} \quad (2)$$

Therefore, an LLR table is generated so that an LLR value obtained from the following equation (3) is allocated, for example, when the received value y is 0, to the assumed channel. The LLR value in the equation (3) is rounded off to one decimal place.

[Equation 3]
$$LLR(y=0) = \ln \frac{P(y=0 \mid x=0)}{P(y=0 \mid x=1)} = -7.6 \quad (3)$$

Similarly, when other received values y are respectively 1 to 3, the LLR table is generated so that an LLR value obtained from the following equations (4) to (6) is allocated. The LLR values in the equations (4) to (6) are rounded off to one decimal place.

[Equation 4]
$$LLR(y=1) = \ln \frac{P(y=1 \mid x=0)}{P(y=1 \mid x=1)} = -1.9 \quad (4)$$

[Equation 5]
$$LLR(y=2) = \ln \frac{P(y=2 \mid x=0)}{P(y=2 \mid x=1)} = 1.3 \quad (5)$$

[Equation 6]
$$LLR(y=3) = \ln \frac{P(y=3 \mid x=0)}{P(y=3 \mid x=1)} = 4.9 \quad (6)$$

The LLR table generated as described above can be sufficiently approximated to an LLR table generated from the true channel transition matrix by collecting a sufficient number of pairs of (x, y). That is, if a sufficient number of pairs of (x, y) can be collected, "estimation of a channel necessary for soft-decision decoding" can be performed accurately, thereby enabling to generate an ideal "LLR table" with respect to the channel to be decoded.

"Estimation of a channel" is described next. For example, when the number of channels to be decoded is numerous, there may be a case in which an LLR table cannot be prepared beforehand for all the different channels. In this case, if decoding has succeeded fortunately, an estimated transmitted value (hereinafter, "estimated value") k matches the transmitted value x. Therefore, generation of an LLR table as described above is performed by using the estimated value k instead of the transmitted value x, and the LLR table generated in this manner is used for an ECC frame for which decoding has failed in the similar channel. Accordingly, even if an LLR table cannot be prepared beforehand, deterioration of decoding characteristics can be suppressed.

However, even if decoding has failed, if the number of error bits is decreased to some extent by the decoding, the sequence {k} of the estimated value k is used to perform generation of an LLR table described above, and by using the LLR table newly obtained (hereinafter, "estimated LLR table"), decoding may succeed.

In this manner, in decoding in a memory system, if a channel assumed beforehand and an actual channel are different, the probability of decoding failure increases. However, an estimated channel based on a failed decoding result may be able to be approximated to a correct channel.

Therefore, according to the present embodiment, even if decoding fails, by performing a procedure to estimate a channel based on a failed result, in other words, a procedure to generate an LLR table at least once, a decoding failure based on the mismatch of the channels can be recovered.

FIG. 4 is a block diagram illustrating a more detailed configuration example of the soft-decision decoding unit according to the present embodiment. As illustrated in FIG. 4, the soft-decision decoding unit 182 includes an LLR converting unit 101, a decoder 102, an estimated LLR-table generation control unit 103, an estimated channel transition matrix aggregating unit 104, an estimated LLR-table generating unit 105, and a received word buffer 106.

In this configuration, the received word buffer 106 stores the sequence {y} of the received value y per ECC frame. Specifically, the received word buffer 106 is input with the sequence {y} of the received value y read from the non-volatile memory 20 per ECC frame and stores the sequence {y} therein. Further, the estimated LLR-table generation control unit 103 inputs an instruction of output start, information specifying whether to output a sequence {y} of the received value y regarding which ECC frame, or information specifying whether to output a specific received value y in the ECC frame to the received word buffer 106. The received word buffer 106 outputs the specified sequence {y} or the specified received value y, of the received values y per ECC frame currently saved, to the estimated channel transition matrix aggregating unit 104 according to the instruction of output start.

The estimated LLR-table generation control unit 103 sequentially generates estimated channel transition matrixes from specific pairs of (k, y). Specifically, a sequence {k} of the estimated value k per ECC frame is input to the estimated LLR-table generation control unit 103 as a decoding result from the decoder 102. Further, information obtained after decoding, relating to whether decoding has succeeded or failed, is input to the estimated LLR-table generation control unit 103. The estimated LLR-table generation control unit 103 determines whether to output the input sequence {k} of the estimated value k to the outside or to the estimated channel transition matrix aggregating unit 104, and outputs the sequence {k} of the estimated value k to a determined destination. Further, the estimated LLR-table generation control unit 103 outputs a signal instructing the received word buffer 106 to start output and a control signal for controlling the estimated channel transition matrix aggregating unit 104.

The estimated channel transition matrix aggregating unit 104 aggregates the pairs of (k, y) to generate an estimated channel transition matrix and saves the estimated channel transition matrix therein. Specifically, the estimated channel transition matrix aggregating unit 104 inputs a sequence {k} of the estimated value k per ECC frame selected by the estimated LLR-table generation control unit 103, and a sequence {y} of the received value y belonging to the same ECC frame as the sequence {k} of the estimated value k input from the estimated LLR-table generation control unit 103, which is an output from the received word buffer 106. The estimated channel transition matrix aggregating unit 104 aggregates pairs of (k, y) from the input sequences {k} and {y}, to generate a frequency distribution, which becomes the base of the estimated channel transition matrix. Further, the estimated channel transition matrix aggregating unit 104 outputs the generated estimated channel transition matrix or frequency distribution to the estimated LLR-table generating unit 105. The estimated LLR-table generation control unit 103 also inputs a reset signal of the aggregation results, a control signal informing an output timing, and the like to the estimated channel transition matrix aggregating unit 104.

The estimated LLR-table generating unit 105 calculates an estimated LLR table based on the estimated channel transition matrix or the frequency distribution input from the estimated channel transition matrix aggregating unit 104. The estimated LLR-table generating unit 105 then outputs the estimated LLR table obtained by calculation to the LLR converting unit 101.

The LLR converting unit 101 converts the received value y read from the non-volatile memory 20 and input thereto to an LLR value by using the LLR table specified by the estimated LLR-table generating control unit 103 or the estimated LLR table. Specifically, the sequence {y} of the received value y read from the non-volatile memory 20 is input to the LLR converting unit 101. Further, a default LLR table to be used for conversion between the received value y and the LLR value, and an LLR table from the estimated LLR-table generating unit 105 to be used for conversion between the received value y and the LLR value are also input to the LLR converting unit 101. The estimated LLR-table generation control unit 103 also inputs specification information of the LLR table to be used to the LLR converting unit 101. The LLR converting unit 101 outputs a sequence of the LLR value obtained by converting the received value y by using the LLR table specified by the estimated LLR-table generation control unit 103 to the decoder 102.

The decoder 102 calculates information relating to decoding and the sequence {k} of the estimated value k based on the sequence of the LLR value per ECC frame. Specifically, the LLR converting unit 101 inputs the sequence of the LLR value to the decoder 102. A sequence corresponding to the ECC frame is input to the decoder 102 by one decoding operation. The decoder 102 outputs the sequence {k} of the estimated value k obtained by decoding the input sequence of the LLR value to the estimated LLR-table generation control unit 103. The decoder 102 also outputs the sequence {k} corresponding to the ECC frame as a result of one decoding operation. The decoder 102 also outputs information obtained by decoding such as success and failure of decoding to the estimated LLR-table generation control unit 103.

Figure 5:
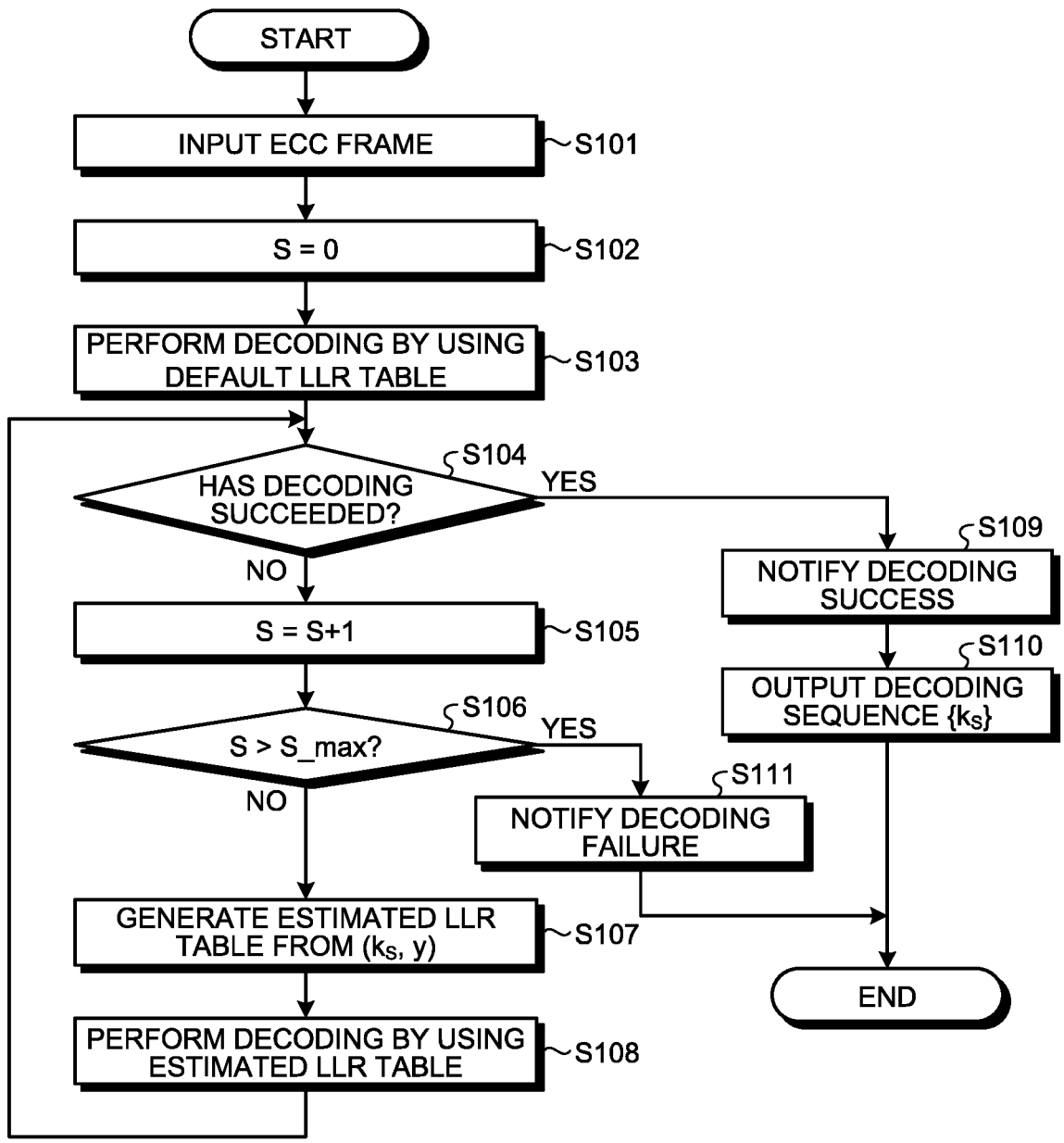
FIG. 5 is a flowchart illustrating a schematic example of a decoding operation according to the first embodiment.

A decoding operation according to the present embodiment is described next in detail with reference to the drawings. FIG. 5 is a flowchart illustrating a schematic example of the decoding operation according to the present embodiment. As illustrated in FIG. 5, in the operation, the sequence {y} of the received value y per ECC frame read from the non-volatile memory 20 by the memory I/F 13 is first input to the soft-decision decoding unit 182 (Step S101). The sequence {y} input to the soft-decision decoding unit 182 is stored in the received word buffer 106 and also input to the LLR converting unit 101.

Next, for example, the estimated LLR-table generation control unit 103 resets a count value S of a counter (not illustrated) that counts the number of repetitions of generation of the estimated LLR table (S=0) (Step S102). Subsequently, the input sequence {y} of the received value y is decoded by using the default LLR table (Step S103). Specifically, the estimated LLR-table generation control unit 103 inputs an instruction to set an LLR table to be used with respect to the input sequence {y} of the received value y as the default LLR table, for example, based on that the count value S is zero to the LLR converting unit 101. The LLR converting unit 101 uses the specified default LLR table to convert the sequence {y} of the received value y to a sequence of the LLR value and inputs the obtained sequence of the LLR value to the decoder 102. The decoder 102 decodes the input sequence of the LLR value and outputs the sequence {k} of the estimated value k obtained as a result of decoding and information regarding success and failure of decoding to the estimated LLR-table generation control unit 103. In the following descriptions, an estimated value k obtained when the count value is S is designated as $k_S$, and a sequence of the estimated value $k_S$ is designated as a decoded sequence $\{k_S\}$.

Next, for example, the estimated LLR-table generation control unit 103 determines whether decoding has succeeded based on the information input from the decoder 102 (Step S104). If decoding has succeeded (YES at Step S104), the operation proceeds to Step S109. On the other hand, if decoding has failed (NO at Step S104), for example, the estimated LLR-table generation control unit 103 increments the count value S by 1 (Step S105). Subsequently, the estimated LLR-table generation control unit 103 decides whether the count value S is larger than a maximum value S_max of the number of repetitions (Step S106). The maximum value S_max is a limit value for avoiding that generation of the estimated LLR table based on the failed decoding result (Steps S104 to S108) is repeated forever. When the count value S is larger than the maximum value S_max (YES at Step S106), the operation proceeds to Step S111. On the other hand, when the count value S is equal to or smaller than the maximum value S_max (NO at Step S106), the operation proceeds to Step S107.

At Step S107, an estimated LLR table is generated based on each frequency of the pair ($k_S$, y) of the estimated value $k_S$ obtained by decoding at Step S103 or S108 and the received value y. Specifically, the estimated channel transition matrix aggregating unit 104 generates a pair ($k_S$, y) from the sequence $\{k_S\}$ of the estimated value $k_S$ input via the estimated LLR-table generation control unit 103 and the sequence {y} of the received value y input from the received word buffer 106 and aggregates the frequencies of respective pairs. The estimated channel transition matrix aggregating unit 104 generates an estimated channel transition matrix, which is a list of likelihood $P(y|k_S)$, or a frequency distribution based on the current aggregation result and inputs the generated estimated channel transition matrix or frequency distribution to the estimated LLR-table generating unit 105. The estimated LLR-table generating unit 105 generates an estimated LLR table by using, for example, the above-described equations (3) to (6) based on the input estimated channel transition matrix or frequency distribution. The generated estimated LLR table is input to the LLR converting unit 101.

Next, the sequence {y} of the received value y is decoded by using the estimated LLR table (Step S108). Specifically, the estimated LLR-table generation control unit 103 inputs an instruction to set an LLR table to be used for the sequence {y} of the received value y as the newly generated estimated LLR table, for example, based on the count value S not being zero to the LLR converting unit 101. The LLR converting unit 101 uses the specified estimated LLR table to convert the sequence {y} of the received value y to a sequence of the LLR value and inputs the sequence of the LLR value obtained thereby to the decoder 102. The decoder 102 decodes the input sequence of the LLR value and outputs a decoding sequence $\{k_S\}$ of the estimated value $k_S$ obtained as a result of decoding and information regarding success and failure of decoding to the estimated LLR-table generation control unit 103. Thereafter the operation returns to Step S104.

At Step S109, that is, when decoding at Step S103 or S108 has succeeded (YES at Step S104), decoding success is notified, for example, from the estimated LLR-table generation control unit 103 to the control unit 11 (see FIG. 1). The estimated LLR-table generation control unit 103 also outputs the decoding sequence $\{k_S\}$ of the estimated value $k_S$ obtained by decoding (Step S110). Thereafter, the operation ends. The output decoding sequence $\{k_S\}$ is accumulated, for example, in the data buffer 12 (see FIG. 1) and after being restored to user data, which is a write value, is transmitted to the host 30 that has issued the read request.

At Step S111, that is, when decoding has not succeeded even if generation of the estimated LLR table is repeated until the count value S reaches the maximum value S_max (YES at Step S106), for example, the estimated LLR-table generation control unit 103 notifies the control unit 11 (see FIG. 1) of a decoding failure and the operation ends. In response thereto, the control unit 11 transmits, for example, a read error of requested data to the host 30 that has issued the read request.

As described above, according to the present embodiment, even when decoding has failed, generation of an estimated LLR table is performed at least once by using the sequence {k} of the estimated value k obtained by the failed decoding. Accordingly, an estimated channel can be approximated to a correct channel. As a result, because a possibility of recovering a decoding failure resulting from mismatch of the channels increases, a memory system that can suppress deterioration of decoding capability based on mismatch of the channels can be realized.

Second Embodiment

A memory system and a control method according to a second embodiment is described in detail with reference to the drawings. Descriptions of configurations and operations identical to those of the first embodiment are applied to the following descriptions to omit redundant descriptions thereof.

The memory system according to the first embodiment has a configuration in which by repeating an operation of generating the estimated LLR table based on a failed decoding result at least once, the estimated channel is approximated to the correct channel. Meanwhile, a memory system according to the second embodiment has a configuration in which the estimated LLR table generated in the same manner as that of the first embodiment is further modified.

The memory system according to the present embodiment can have an identical configuration to that of the memory system 1 explained with reference to FIG. 1 in the first embodiment. However, in the present embodiment, the soft-decision decoding unit 182 in FIG. 4 is replaced by a soft-decision decoding unit 282 illustrated in FIG. 6.

Figure 6:
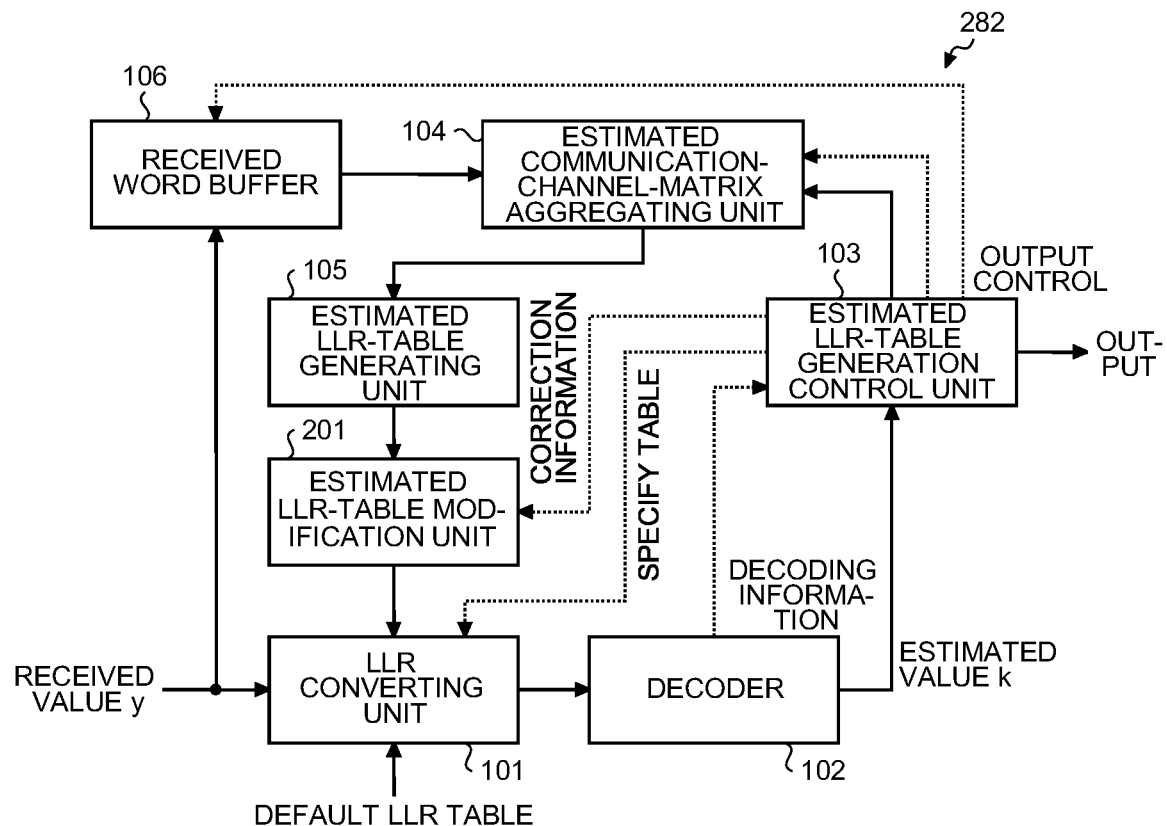
FIG. 6 is a block diagram illustrating a more detailed configuration example of a soft-decision decoding unit according to a second embodiment.

As illustrated in FIG. 6, the soft-decision decoding unit 282 according to the present embodiment further includes an estimated LLR-table modification unit 201 in addition to the configuration identical to the soft-decision decoding unit 182 illustrated in FIG. 4. The estimated LLR-table modification unit 201 modifies the estimated LLR table generated by the estimated LLR-table generating unit 105 according to an instruction, for example, from the estimated LLR-table generation control unit 103 and inputs a modified estimated LLR table to the LLR converting unit 101.

Figure 7:
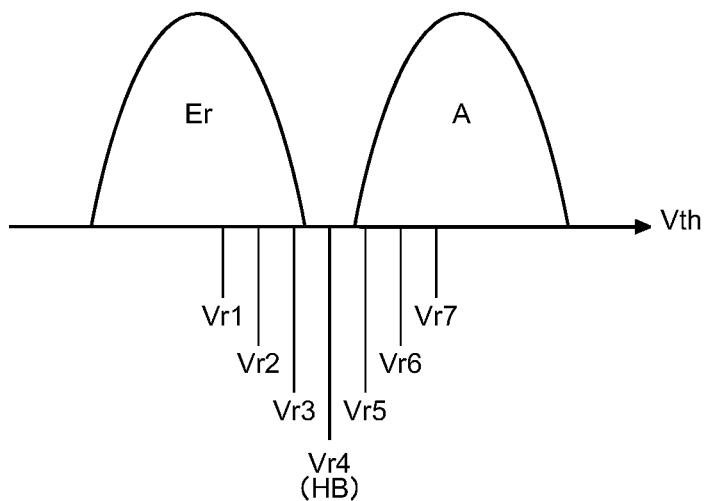
FIG. 7 is a schematic diagram illustrating a relation between a threshold voltage distribution and a read voltage.

An example of modification performed by the estimated LLR-table modification unit 201 is described here. FIG. 7 is a schematic diagram illustrating a relation between a threshold voltage distribution and a read voltage when each memory cell constituting the non-volatile memory 20 is a single level cell (SLC) that records 1-bit data. In FIG. 7, an Er distribution indicates a distribution of a threshold voltage of a memory cell in which, for example, data of "1" is written, and an A distribution indicates a distribution of a threshold voltage of a memory cell in which, for example, data of "0" is written. Further, Vr1 to Vr7 indicates examples of a read voltage (hereinafter, "read level") to be used at the time of reading data from the memory cell. Of Vr1 to Vr7, Vr4 indicates an example of a read level to be used at the time of performing hard-decision read (hard bit read), and Vr1 to Vr3 and Vr5 to Vr7 indicate examples of read levels to be used at the time of performing soft-decision read (soft bit read). However, the read level to be used at the time of performing soft bit read may include Vr4.

If the threshold voltage of the memory cell is, for example, a voltage near a peak of the Er distribution with respect to such a threshold voltage distribution, there is a high possibility that the data value held by the memory cell is "1". Similarly, if the threshold voltage of the memory cell is, for example, a voltage near a peak of the A distribution, there is a high possibility that the data value held by the memory cell is "0". Therefore, as an example of modification performed by the estimated LLR-table modification unit 201 in such a case, when it is recognized from the read data that the threshold voltage of the memory cell is near the peak of either distribution, it is considered that there is a high probability of a value corresponding to the distribution and correction is performed so that an absolute value of the LLR value becomes high.

If the threshold voltage of the memory cell is, for example, a voltage near a boundary between the Er distribution and the A distribution, the possibility of the data value held by the memory cell being "1" and the possibility of the data value being "0" are approximately the same. Therefore, as an example of correction performed by the estimated LLR-table correcting unit 201 in such a case, when it is recognized from the read data that the threshold voltage of the memory cell is near the boundary of adjacent distributions, it is considered that it is indeterminate to which distribution the value corresponds, and modification is performed so that an absolute value of the LLR value becomes low. At that time, positive and negative of the LLR value may be inverted.

As a correction method, various method can be applied, such as a method of setting an absolute value of the LLR value to a fixed value or a method of adding or subtracting a predetermined value to or from the absolute value of the LLR value.

Figure 8:
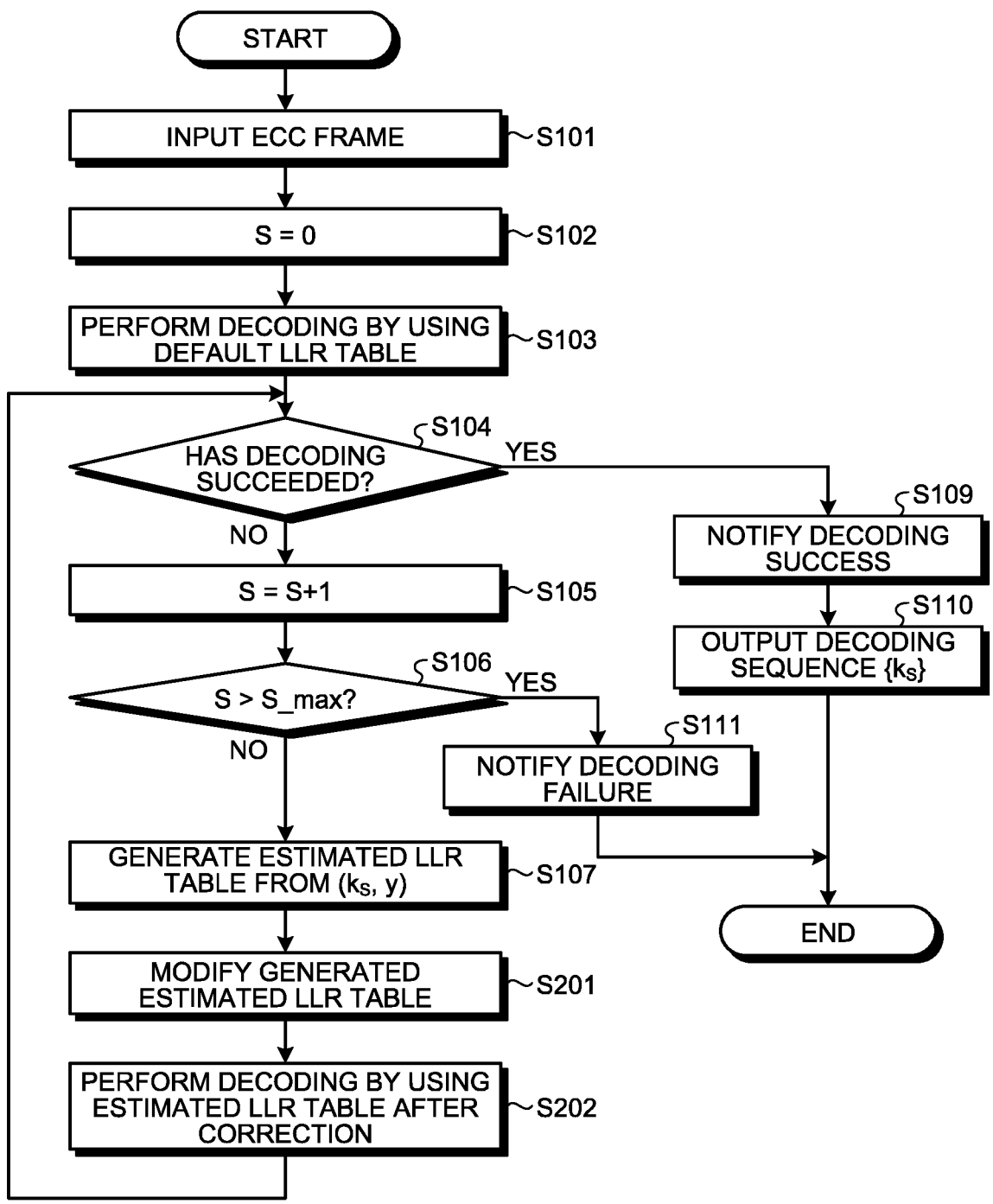
FIG. 8 is a flowchart illustrating a schematic example of a decoding operation according to the second embodiment.

A decoding operation according to the present embodiment is described next in detail with reference to the drawings. FIG. 8 is a flowchart illustrating a schematic example of the decoding operation according to the present embodiment. As illustrated in FIG. 8, in the decoding operation according to the present embodiment, Step S108 is replaced by Steps S201 to S202 in the similar operation to the decoding operation according to the first embodiment illustrated in FIG. 5.

That is, in the present embodiment, when an estimated LLR table is generated from respective frequencies of the pair ($k_S$, y) of the estimated value $k_S$ and the received value y obtained by decoding at Step S103 or S202 (Step S107), the generated estimated LLR table is modified (Step S201). Specifically, when the estimated LLR table generated by the estimated LLR-table generating unit 105 is input to the estimated LLR-table modification unit 201, the estimated LLR-table modification unit 201 modifies the estimated LLR table based on modification information input from the estimated LLR-table generation control unit 103 and inputs the estimated LLR table after modification to the LLR converting unit 101.

Next, the sequence {y} of the received value y is decoded by using the estimated LLR table after modification (Step S202). Specifically, the estimated LLR-table generation control unit 103 inputs an instruction to set an LLR table to be used with respect to the sequence {y} of the received value y as the newly generated and modified estimated LLR table, for example, based on the count value S not being zero to the LLR converting unit 101. The LLR converting unit 101 uses the specified estimated LLR table after modification to convert the sequence {y} of the received value y to a sequence of the LLR value and inputs the sequence of the LLR value obtained thereby to the decoder 102. The decoder 102 decodes the input sequence of the LLR value and outputs a decoding sequence {$k_S$} of the estimated value $k_S$ obtained as a result thereof and information regarding success and failure in decoding to the estimated LLR-table generation control unit 103.

As described above, the present embodiment has a configuration in which an estimated LLR table generated based on a failed decoding result is corrected. Accordingly, in the present embodiment, if modification is appropriate with respect to stress, the estimated LLR table can be modified so that decoding succeeds more stably.

Other configurations, operations, and effects are identical to those of the embodiment described above, and thus detailed descriptions thereof are omitted.

Third Embodiment

A memory system according to a third embodiment is described in detail with reference to the drawings. Descriptions of configurations and operations identical to those of the first and second embodiments are applied to the following descriptions to omit redundant descriptions thereof.

In the first and second embodiments described above, a case in which the estimated LLR table is generated based on a decoding result of one ECC frame is exemplified. Meanwhile, in the third embodiment, a case in which an estimated LLR table is generated based on decoding results of a plurality of ECC frames is exemplified.

In a case of channels assumed to be affected by similar noise, the conditional probability P(y|x) obtained from these channels becomes similar. Therefore, according to the present embodiment, when a plurality of ECC frames assumed to be affected by noise in similar channels can be collectively processed, an estimated LLR table is generated based on an aggregation result of all the ECC frames. Accordingly, it becomes possible to increase the number of pairs of (k, y) to be used for generating the estimated LLR table, and thus the estimated channel can be further approximated to a true channel. As the channels assumed to be affected by similar noise, ECC frames written in the same or adjacent word line can be assumed, although not limited thereto.

Configurations of the memory system and the decoding unit according to the present embodiment can be identical to those of the memory system 1 and the soft-decision decoding unit 182 or 282 according to the first or second embodiment described above. However, according to the present embodiment, the soft-decision decoding unit 182 or 282 is configured so that a plurality of ECC frames can be collectively processed, and a plurality of ECC frames are input to the decoding unit 102, and a plurality of ECC frames are stored in the received word buffer 106.

A decoding operation according to the present embodiment is described next in detail with reference to the drawings. In the following descriptions, the decoding operation is based on the decoding operation exemplified in the second embodiment (see FIG. 8), but is not limited thereto, and can be variously modified, for example, the decoding operation is based on the decoding operation exemplified in the first embodiment (see FIG. 5).

Figure 9:
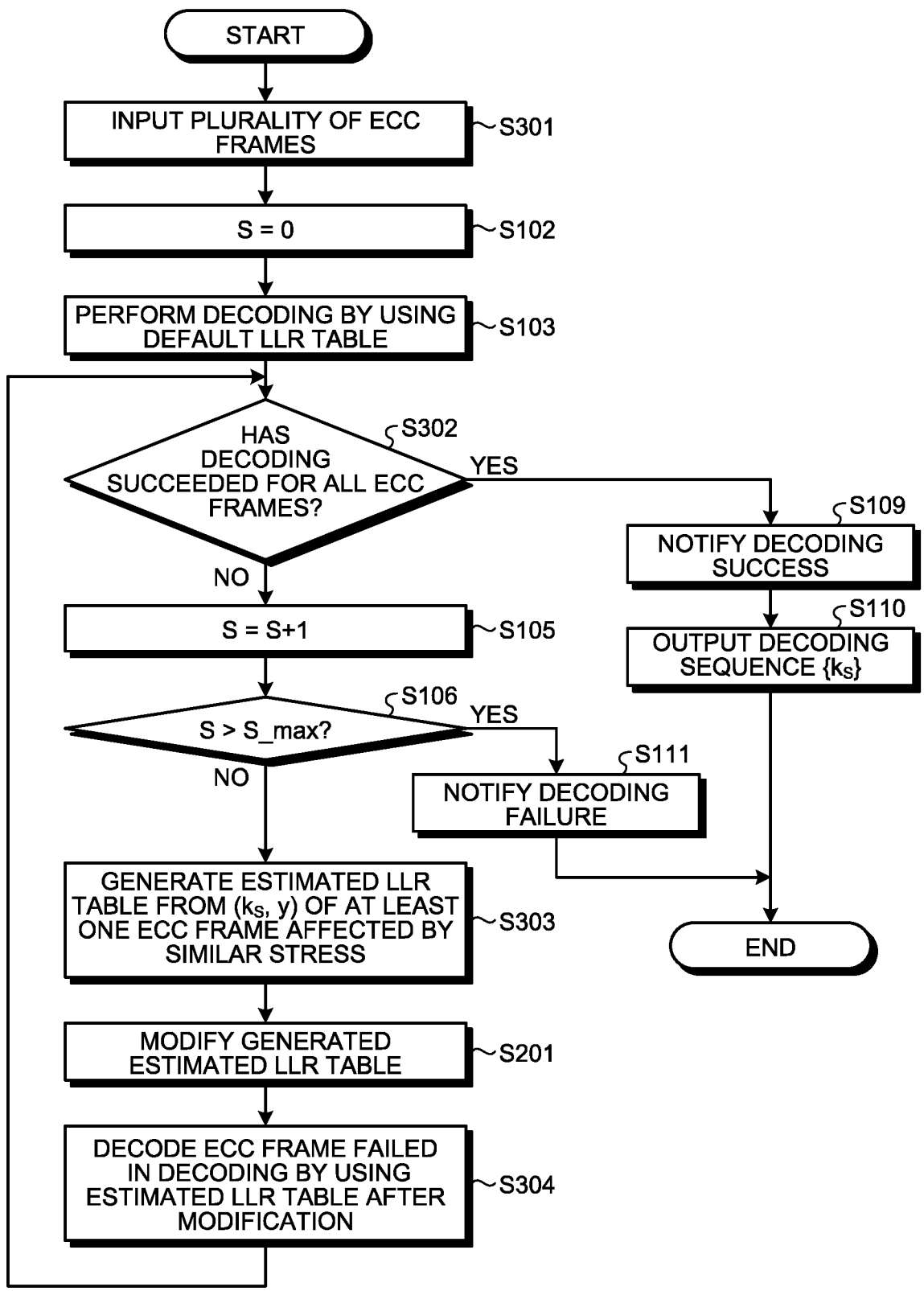
FIG. 9 is a flowchart illustrating a schematic example of a decoding operation according to a third embodiment.

FIG. 9 is a flowchart illustrating a schematic example of the decoding operation according to the present embodiment. As illustrated in FIG. 9, in the decoding operation according to the present embodiment, Steps S101, S104, S107, and S202 are respectively replaced by Steps S301, S302, S303, and S304 in the similar operation to the decoding operation according to the second embodiment illustrated in FIG. 8.

That is, in the present embodiment, the sequence $\{y\}$ of the ECC frames read from the non-volatile memory 20 by the memory I/F 13 is first input to the soft-decision decoding unit 282 (Step S301). The sequence $\{y\}$ of the ECC frames input to the soft-decision decoding unit 282 is stored in the received word buffer 106 and also input to the LLR converting unit 101.

Next, after the count value S is reset (S=0) (Step S102), the input sequence $\{y\}$ of the ECC frames is decoded by using the default LLR table (Step S103). Decoding with respect to the sequence $\{y\}$ of an individual ECC frame can be performed in the same manner as that of the embodiments described above.

Next, for example, the estimated LLR-table generation control unit 103 determines whether decoding with respect to all the ECC frames has succeeded or failed, based on information input from the decoder 102 (Step S302) When decoding with respect to all the ECC frames has succeeded (YES at Step S302), the operation proceeds to Step S109 to perform subsequent operations. On the other hand, if there is an ECC frame for which decoding has failed (NO at Step S302), the count value S is incremented by 1 (Step S105), and it is decided whether the incremented count value S is larger than the maximum value S_max (Step S106). Thereafter, when the count value S is larger than the maximum value S_max (YES at Step S106), the operation proceeds to Step S111 to perform subsequent operations. On the other hand, when the count value S is equal to or smaller than the maximum value S_max (NO at Step S106), the operation proceeds to Step S303.

At Step S303, an estimated LLR table is generated based on respective frequencies of the pair ($k_S$, y) of the sequence $\{k_S\}$ of the estimated value $k_S$ and the received value y of one or more ECC frames having been subjected to similar stress, of the sequences $\{k_S\}$ of the estimated value $k_S$ obtained by decoding at Step S103 or S304. Specifically, the estimated channel transition matrix aggregating unit 104 identifies at least one ECC frame assumed to be affected by the similar stress, from the ECC frames input via the estimated LLR-table generation control unit 103. Subsequently, the estimated channel transition matrix aggregating unit 104 generates a pair of $\{k_S, y\}$ based on the respective sequences $\{k_S\}$ of the estimated value $k_S$ of the identified at least one ECC frame and the sequence $\{y\}$ of the received value y input from the received word buffer 106 and aggregates the frequencies of the respective pairs. The estimated channel transition matrix aggregating unit 104 generates an estimated channel transition matrix, which is a list of likelihood $P(y|k_S)$, or a frequency distribution based on the current aggregation result and inputs the generated estimated channel transition matrix or frequency distribution to the estimated LLR-table generating unit 105. The estimated LLR-table generating unit 105 generates an estimated LLR table by using, for example, the above-described equations (3) to (6) based on the input estimated channel transition matrix or frequency distribution. The generated estimated LLR table is input to the estimated LLR-table modification unit 201 and is corrected (Step S201).

Next, the sequence $\{y\}$ of the received value y in an ECC frame for which decoding has not yet succeeded, of all the ECC frames, is decoded by using the estimated LLR table after modification (Step S304). Decoding with respect to the sequence $\{y\}$ of an individual ECC frame can be similar to that of the embodiments described above. Thereafter, the operation returns to Step S302.

As described above, in the present embodiment, when a plurality of ECC frames assumed to be affected by noise in similar channels can be collectively processed, an estimated LLR table is generated based on an aggregation result of all the ECC frames. Accordingly, the number of pairs of (k, y) to be used for generating the estimated LLR table can be increased, thereby enabling to approximate the estimated channel further to a true channel.

Other configurations, operations, and effects are identical to those of the embodiments described above, and thus detailed descriptions thereof are omitted.

Next, the effects of the embodiments described above are explained with a specific example. In the following descriptions, attention is focused on the third embodiment and such a case is exemplified that although it is assumed that conditions of stress applied on the respective ECC frames are the same, the true channels of the respective ECC frames are not the same due to variability in places where the respective ECC frames are recorded.

Figure 10:
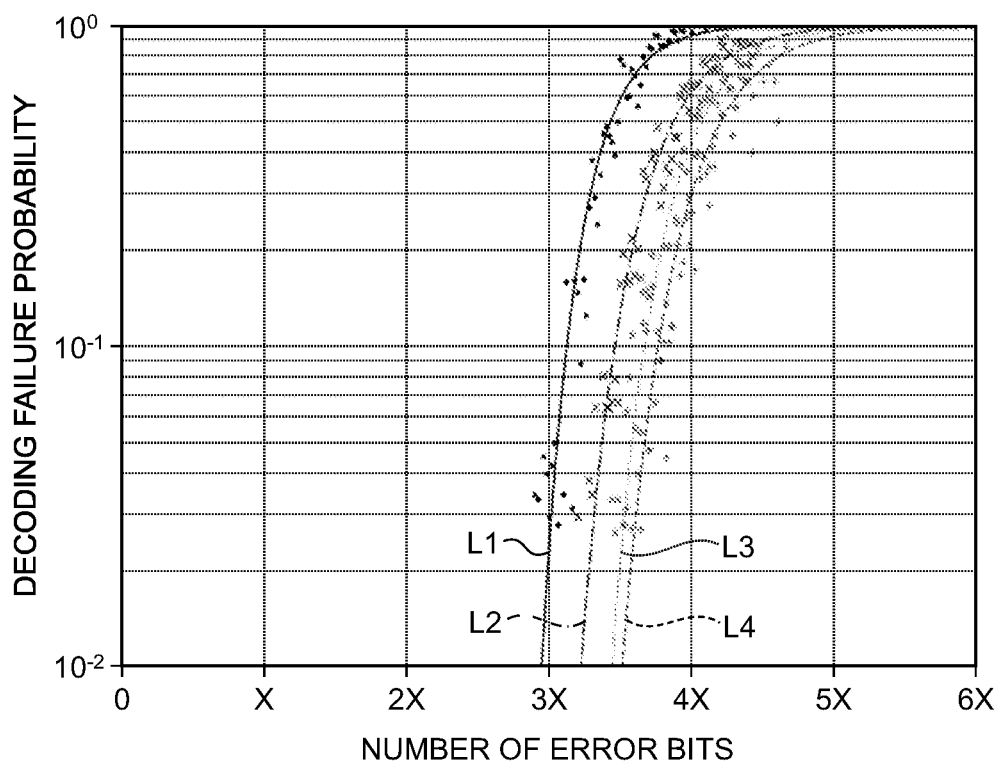
FIG. 10 is a diagram illustrating decoding characteristics and interpolation curves thereof obtained by a memory system according to the third embodiment.

FIG. 10 is a diagram illustrating a decoding result obtained by aggregating a number of ECC frames applied with certain stress with respect to a NAND flash memory of a certain generation, and interpolation curves thereof. FIG. 10 represents how decoding capabilities change with a value of the number of repetitions S_max, in a case where the modification exemplified in the second embodiment (see Step S201 in FIG. 8 or FIG. 9) is not performed.

In FIG. 10, a horizontal axis represents the number of error bits and a vertical axis represents a decoding failure probability. When a plurality of ECC frames including some error bits are observed, each point in FIG. 10 represents a percentage of an ECC frame for which decoding has failed among the ECC frames at the number of error bits. The interpolation curve is a visual rough indication and does not ensure a decoding failure probability as indicated by the curved line.

Further, a curved line L1 is an interpolation curve indicating decoding characteristics when decoding is performed by using the default LLR table (a first case).

A curved line L2 is an interpolation curve indicating decoding capabilities when decoding is performed again by using an estimated LLR table generated based on existing decoding failure results. A curved line L3 is an interpolation curve indicating decoding characteristics when the number of repetitions S_max is 2. A curved line L4 is an interpolation curve indicating decoding capabilities when the number of repetitions S_max is 5.

As is obvious from FIG. 10, it is understood that the error correction capability is improved by an increase in the number of repetitions S_max.

Figure 11:
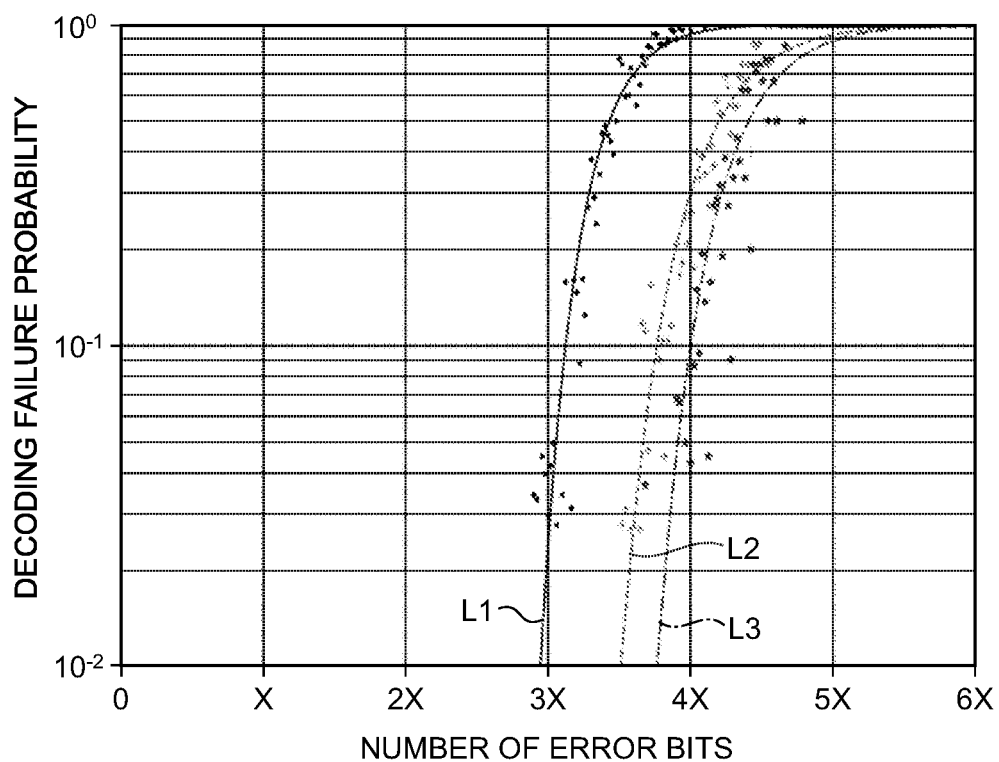
FIG. 11 is a diagram illustrating other decoding characteristics and interpolation curves obtained by the memory system according to the third embodiment.

FIG. 11 is a graph representing a difference between a case in which modification is not performed and a case in which modification is performed to increase an absolute value of the LLR value with respect to a value in which it is strongly assumed that the likelihood takes a maximum value, with respect to the same data as that used in FIG. 10. A curved line L1 and a curved line L2 in FIG. 11 are the same as the curved line L1 and the curved line L4 in FIG. 10. A curved line L3 in FIG. 11 is an interpolation curve when the modification is performed by setting the number of repetitions S_max to 5.

As is obvious from FIG. 11, it is understood that the error correction capability is improved by modification regarding certain stress.

Fourth Embodiment

A memory system according to a fourth embodiment is described next in detail with reference to the drawings. Descriptions of configurations and operations identical to those of the first to third embodiments are applied to the following descriptions to omit redundant descriptions thereof.

The first embodiment includes a configuration in which a channel to be estimated is approximated to a correct channel by repeating an operation to generate an estimated LLR table based on a failed decoding result at least once. Meanwhile, the fourth embodiment includes a configuration in which a posteriori probability information can be used for generating an estimated LLR table.

The memory system according to the present embodiment can have an identical configuration to the memory system 1 described with reference to FIG. 1 in the first embodiment. However, in the present embodiment, the soft-decision decoding unit 182 in FIG. 4 is replaced by a soft-decision decoding unit 382 illustrated in FIG. 12.

Figure 12:
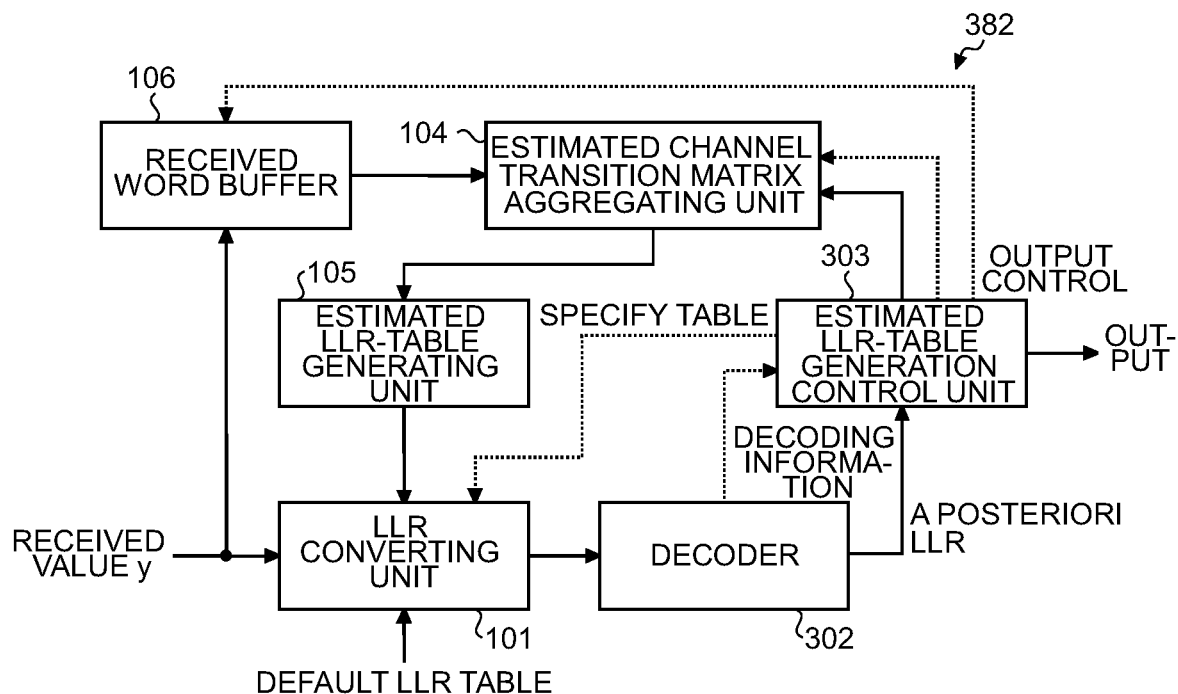
FIG. 12 is a block diagram illustrating a more detailed configuration example of a soft-decision decoding unit according to a fourth embodiment.

As illustrated in FIG. 12, in the soft-decision decoding unit 382 according to the present embodiment, in addition to the configuration identical to the soft-decision decoding unit 182 illustrated in FIG. 4, the decoder 102 that outputs an estimated value in FIG. 4 is replaced by a decoder 302 that outputs an a posteriori LLR illustrated in FIG. 12. The a posteriori LLR is information that becomes the base of an estimated value and is a log-likelihood ratio regarding a posteriori probability information and an output of the soft-decision decoding unit in which estimation by code constraints is added to the sequence {y} of the received value. The estimated value k is obtained from the a posteriori LLR. In a normal case in which a probability of a recorded bit being "0" and a probability of a recorded bit being "1" are the same, positive and negative of an LLR value correspond to the bit "0" and "1", and its absolute value relates to a degree of reliability of estimation of the write value by the decoder.

An output of the decoder 302 can be an extrinsic information instead of the a posteriori LLR. The extrinsic information is a value obtained by subtracting an LLR input to a decoder from the corresponding a posteriori LLR. The fourth embodiment can be realized even if the extrinsic information is used instead of the a posteriori probability information.

In the present embodiment, the estimated LLR-table generation control unit 103 that uses the sequence {k} of the estimated value in FIG. 4 is replaced by an estimated LLR-table generation control unit 303 that uses a sequence {l} of the a posteriori LLR in FIG. 12.

Figure 13:
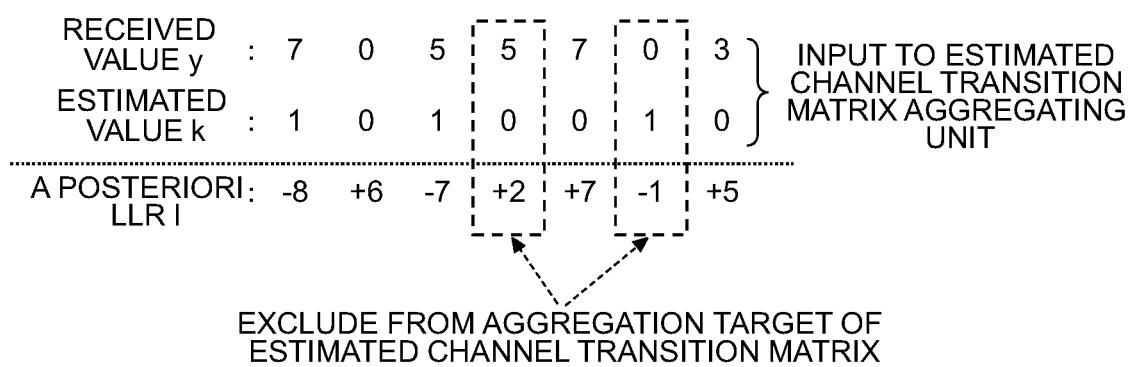
FIG. 13 is a diagram illustrating a specific usage example of an a posteriori LLR in an estimated LLR-table generation control unit according to the fourth embodiment.

A specific usage example of the a posteriori LLR in the estimated LLR-table generation control unit 303 is described with reference to FIG. 13. FIG. 13 illustrates an example of the sequence {y} of the received value, the sequence {l} of the a posteriori LLR, and the sequence {k} of the estimated value obtained from the sequence of the a posteriori LLR. In FIG. 13, a received value, an estimated value, and an a posteriori LLR indicated vertically are respectively information relating to the same bit. If a rightmost bit is focused, an a posteriori LLR paired with a received value 3 is +5. Because this value is positive, a bit "0" becomes the estimated value regarding the rightmost bit. At this time, because an absolute value of the a posteriori LLR is 5, which is not a small value, a pair of (k=0, y=3) is used in the estimated channel transition matrix aggregating unit 104. Meanwhile, regarding a second bit from the right, an absolute value of the a posteriori LLR is a small value as 1. Therefore, (k=1, y=0) regarding the second bit is not used in the estimated channel transition matrix aggregating unit 104. In FIG. 13, a case in which a pair of an estimated value corresponding to the a posteriori LLR with an absolute value thereof being equal to or smaller than 2 and a received value is not used in the estimated channel transition matrix aggregating unit 104 is exemplified. However, a threshold with respect to the absolute value of the a posteriori LLR to be used at the time of determining use/non-use is not limited to 2 and can be variously changed.

Figure 14:
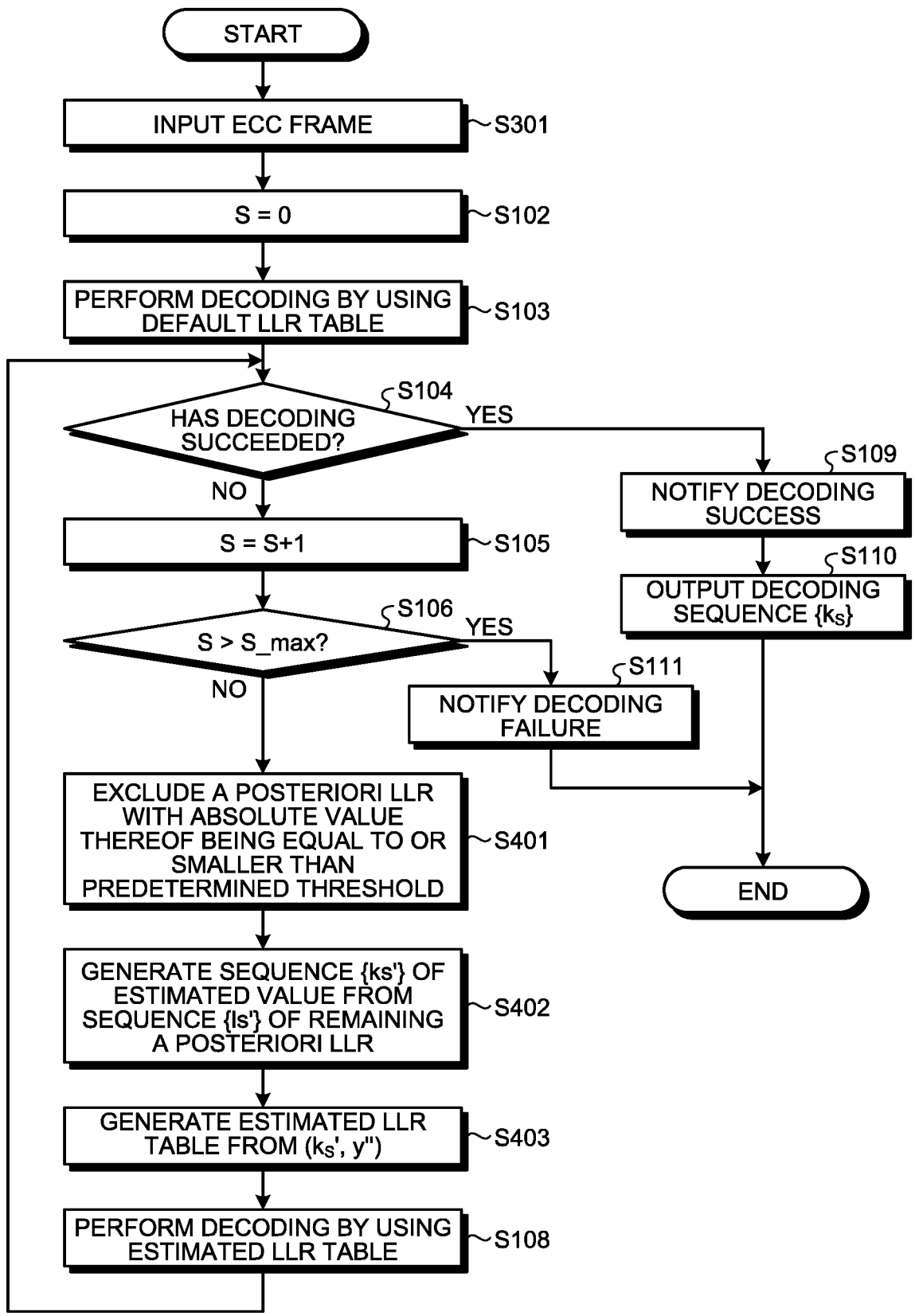
FIG. 14 is a flowchart illustrating a schematic example of a decoding operation according to the fourth embodiment.

A decoding operation according to the present embodiment is described next in detail with reference to the drawings. FIG. 14 is a flowchart illustrating a schematic example of the decoding operation according to the present embodiment. As illustrated in FIG. 14, in the decoding operation according to the present embodiment, in the similar operation to the decoding operation according to the first embodiment illustrated in FIG. 5, Step S107 is replaced by Steps S401 to S403. Further, at Steps S103 and S108 in FIG. 14, a sequence $\{l_S\}$ of the a posteriori LLR is output as a decoding result instead of the sequence $\{k_S\}$ of the estimated value.

At Step S401, that is, when decoding at Step S103 or S108 has failed (NO at Step S104) and the count value S indicating the number of repetitions is equal to or smaller than the maximum value S_max (NO at Step S106), the estimated LLR-table generation control unit 303 excludes an a posteriori LLR with an absolute value thereof being equal to or smaller than a predetermined threshold (2 in an example illustrated in FIG. 13) from the sequence $\{l_S\}$ of the a posteriori LLR obtained by decoding at Step S103 or S108 (Step S401). Subsequently, the estimated LLR-table generation control unit 303 generates a sequence $\{k_S'\}$ of the estimated value with respect to a remaining sequence $\{l_S'\}$ of the a posteriori LLR (Step S402).

The generated sequence $\{k_S'\}$ of the estimated value is input to the estimated channel transition matrix aggregating unit 104. A sequence {y"} of the received value corresponding to a posteriori LLR with an absolute value thereof being larger than the predetermined threshold is also input to the estimated channel transition matrix aggregating unit 104.

Therefore, at Step S403, the estimated channel transition matrix aggregating unit 104 generates a pair of $(k_S', y'')$ from the sequence $\{k_S'\}$ of the estimated value input from the estimated LLR-table generation control unit 103 and the sequence of $\{y''\}$ of the received value input from the received word buffer 106, aggregates frequencies of respective pairs, generates an estimated channel transition matrix or a frequency distribution based on the aggregation result, and inputs the generated estimated channel transition matrix or frequency distribution to the estimated LLR-table generating unit 105. In response thereto, the estimated LLR-table generating unit 105 generates an estimated LLR table by using, for example, the above-described equations (3) to (6) based on the input estimated channel transition matrix or frequency distribution. The generated estimated LLR table is input to the LLR converting unit 101.

Figure 15:
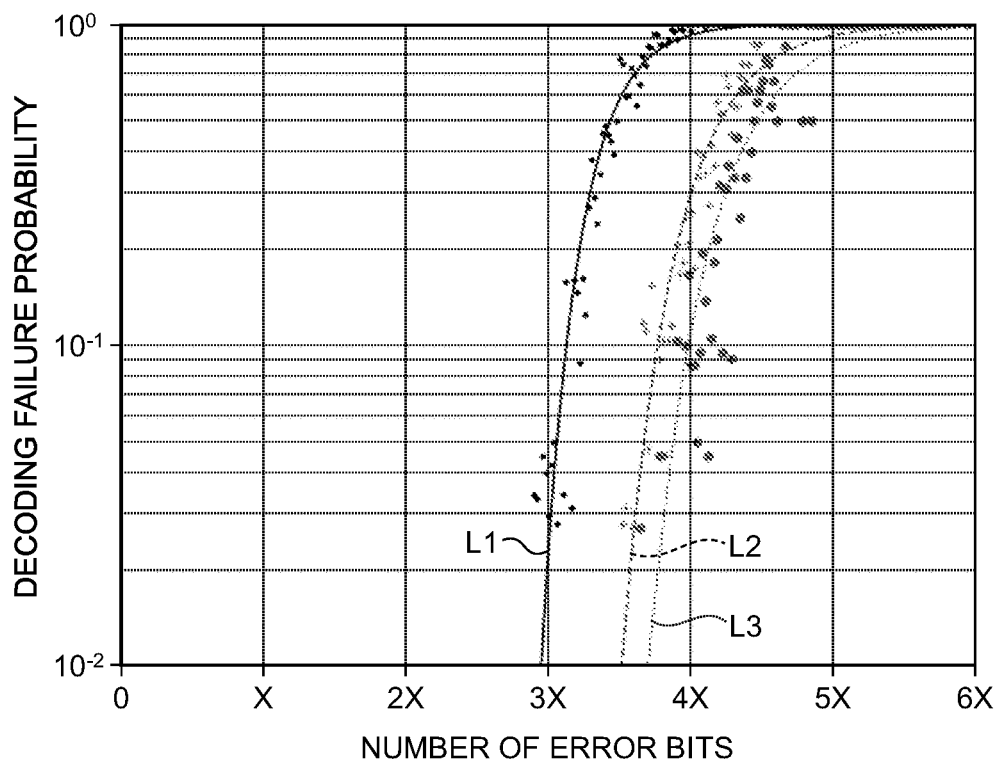
FIG. 15 is a diagram illustrating decoding characteristics and interpolation curves obtained by a memory system according to the fourth embodiment.

Effects of the present embodiment are described next with a specific example. FIG. 15 is a graph representing a difference between a case in which all the pairs of (k, y) are used in the estimated channel transition matrix aggregating unit 104 without performing modification and a case in which the estimated channel transition matrix aggregating unit 104 does not use a pair of (k, y) with the absolute value of the a posteriori LLR being small, with respect to the same data as that used in FIG. 10. A curved line L1 and a curved line L2 in FIG. 15 are the same as the curved line L1 and the curved line L4 in FIG. 10. A curved line L3 in FIG. 15 is an interpolation curve of a result obtained by setting the number of repetitions S_max to 5 and not using a pair of (k, y) with the absolute value of the a posteriori LLR being small.

As is obvious from FIG. 15, it is understood that the error correction capability is improved by imposing a restriction to the pair of (k, y) to be used in certain stress.

As described above, according to the present embodiment, even if a posteriori probability information is used for generation of an estimated LLR table, identical effects as those of the first to third embodiments described above can be obtained. In the present embodiment, the error correction capability can be improved by restricting a pair of (k, y) to be aggregated by the estimated channel transition matrix aggregating unit 104 based on an absolute value of an a posteriori LLR.

Other configurations, operations, and effects are identical to those of the embodiments described above, and thus detailed descriptions thereof are omitted. In the present embodiment, while a case of applying a configuration of using a posteriori probability information for generating an estimated LLR table based on the configuration according to the first embodiment has been exemplified, the configuration to be used as the basis is not limited to the first embodiment. For example, the present embodiment can be applied to the configuration according to the second or third embodiment.

Fifth Embodiment

A memory system according to a fifth embodiment is described next in detail with reference to the drawings. Descriptions of configurations and operations identical to those of the fourth embodiment are applied to the following descriptions to omit redundant descriptions thereof.

The fourth embodiment has such a configuration that an a posteriori LLR with low reliability (for example, an a posteriori LLR with an absolute value being equal to or lower than a predetermined threshold) is excluded to aggregate the frequencies. In such a configuration, the number of samples to be used for generation of the estimated LLR table decreases, and the estimated LLR table that enables to succeed in decoding more stably may not be generated. Meanwhile, the fifth embodiment is configured in such a manner that the a posteriori LLR with low reliability is not excluded but is used for aggregation. Accordingly, the number of samples is increased, thereby enabling to generate an estimated LLR table that enables to succeed in decoding more stably.

The memory system according to the present embodiment can have an identical configuration to that of the memory system 1 described with reference to FIG. 1 in the first embodiment, similarly to the fourth embodiment. However, according to the present embodiment, the soft-decision decoding unit 382 of the fourth embodiment described with reference to FIG. 12 is replaced by a soft-decision decoding unit 582 illustrated in FIG. 16.

Figure 16:
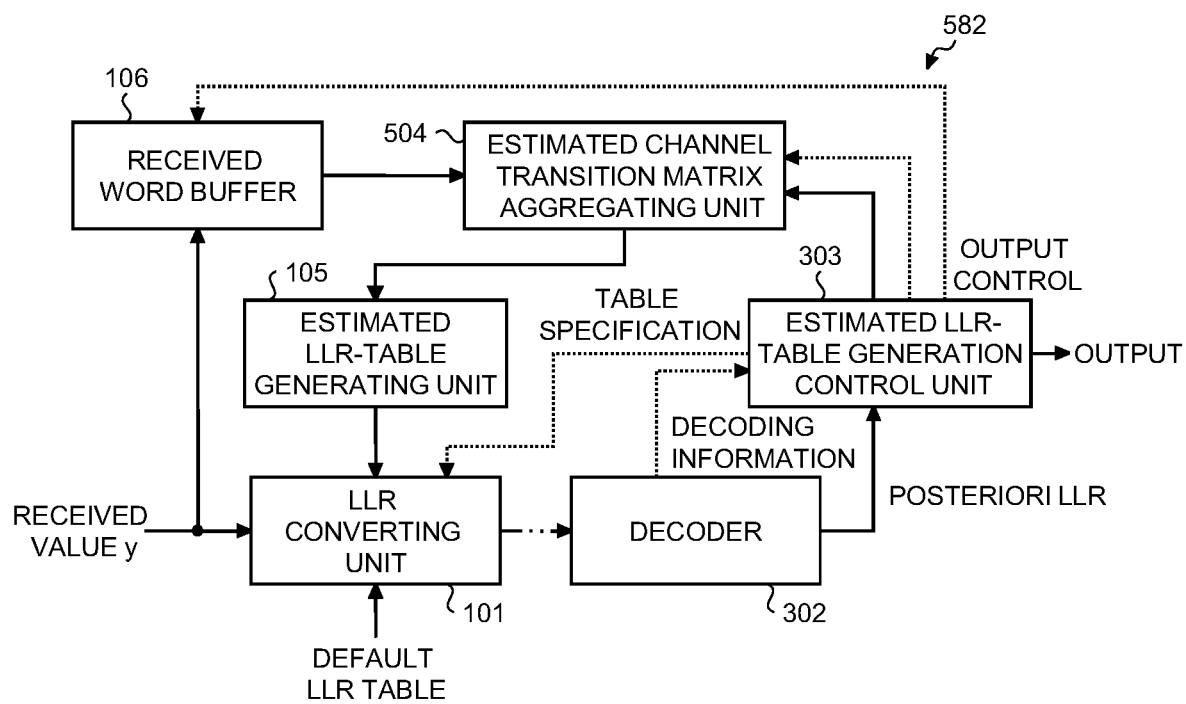
FIG. 16 is a block diagram illustrating a more detailed configuration example of a soft-decision decoding unit according to a fifth embodiment.

As illustrated in FIG. 16, the soft-decision decoding unit 582 according to the present embodiment has an identical configuration to that of the soft-decision decoding unit 382 illustrated in FIG. 12. However, the estimated channel transition matrix aggregating unit 104 in FIG. 12 is replaced by an estimated channel transition matrix aggregating unit 504 illustrated in FIG. 16.

With respect to bits with relatively low reliability (with an absolute value of the a posteriori LLR being small), the estimated channel transition matrix aggregating unit 504 converts a scale value (first scale value) of a counter that counts the frequency (number of occurrences) to a value equal to or smaller than a scale value (second scale value) of the counter with respect to bits with relatively high reliability. The scale value is a value corresponding to a minimum unit (scale) of a counter. The estimated channel transition matrix aggregating unit 504 determines that the reliability is low, for example, when the absolute value of the a posteriori LLR is equal to or smaller than a predetermined threshold, and determines that the reliability is high when the absolute value of the a posteriori LLR is larger than the predetermined threshold. The estimated channel transition matrix aggregating unit 504 uses a counter that can also add fractional values.

Figure 17:
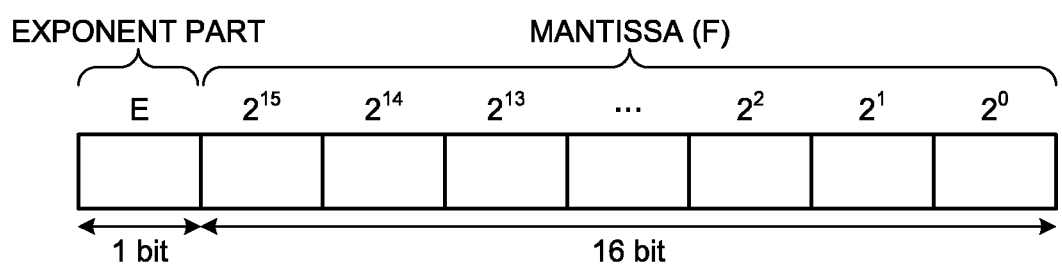
FIG. 17 is a diagram illustrating a configuration example of a counter used in the fifth embodiment.

FIG. 17 is a diagram illustrating a configuration example of a counter used in the present embodiment. In an example of FIG. 17, the counter size is a 17-bit length. One bit at the left end corresponds to an exponent part, and the remaining 16 bits correspond to a mantissa. If it is assumed that the exponent part is E and the mantissa is F, the counter value is expressed by $2^{S(E-1)} \times F$.

S is a numerical value (for example, a natural number) that sets a scale value, and is expressed by $2^{-S}$, for example. When the scale value is $2^{-S}$, a value range that can be expressed by the counter in FIG. 17 becomes $2^{-S}$ to $2^{16}-1$. A minimum unit of the counter with respect to a value smaller than $2^{16-S}$ is $2^{-S}$. A minimum unit of the counter with respect to a value equal to or larger than $2^{16-S}$ is 1. For example, when S=5, the scale value becomes $2^{-5}(=0.03125)$. A minimum unit of the counter with respect to a value smaller than $2^{16-5}=2^{11}=2048$ is $2^{-5}$. A minimum unit of the counter with respect to a value equal to or larger than $2^{11}$ is 1.

The configuration of the counter is not limited to the example in FIG. 17, and any configuration can be applied. FIG. 17 illustrates an example of the counter that represents a floating decimal point; however, it can be a counter that represents a fixed decimal point. While the configuration of the counter becomes complicated in order to represent a decimal point, a configuration illustrated in FIG. 17, for example, can suppress an increase of a circuit size required for the counter. Further, the scale value of the counter is not limited to a configuration in which a scale value with respect to the bits with relatively high reliability (second scale value) is set to 1, and a scale value with respect to the bits with relatively low reliability (first scale value) is set to be equal to or smaller than 1, and any configuration having a relation satisfying "first scale value ≥ second scale value" is applicable.

FIG. 18 is a flowchart illustrating a schematic example of a decoding operation according to the present embodiment. As illustrated in FIG. 18, in the decoding operation according to the present embodiment, Steps S401 to S403 are replaced by Steps S501 to S502 in the same operation as the decoding operation according to the fourth embodiment illustrated in FIG. 14. At Steps S103 and S108, as in the fourth embodiment, a sequence $\{l_S\}$ of the a posteriori LLR is output as a decoding result instead of the sequence $\{k_S\}$ of the estimated value.

When decoding at Steps S103 or S108 has failed (NO at Step S104), and a counter value S indicating the number of repetitions is equal to or smaller than the maximum value S_max (NO at Step S106), the estimated LLR-table generation control unit 303 generates a sequence $\{k_S\}$ of the estimated value with respect to the sequence $\{l_S\}$ of the a posteriori LLR obtained by decoding at Step S103 or S108 (Step S501).

The generated sequence $\{k_S\}$ of the estimated value is input to the estimated channel transition matrix aggregating unit 504. At Step S502, the estimated channel transition matrix aggregating unit 504 generates a pair $(k_S, y)$ from the sequence $\{k_S\}$ of the estimated value input from the estimated LLR-table generation control unit 303 and the sequence $\{y\}$ of the received value input from the received word buffer 106 and aggregates the frequencies of respective pairs. The estimated channel transition matrix aggregating unit 504 generates an estimated channel transition matrix or a frequency distribution based on the aggregation result and inputs the generated estimated channel transition matrix or the frequency distribution to the estimated LLR-table generating unit 105.

At this time, with respect to the a posteriori LLR with the absolute value being equal to or smaller than the predetermined threshold, the estimated channel transition matrix aggregating unit 504 adds a value obtained by multiplying a scale value (for example, $2^{-5}$) described with reference to FIG. 17 by 1 as a frequency.

The estimated LLR-table generating unit 105 generates an estimated LLR table by using, for example, the above-described equations (3) to (6) based on the input estimated channel transition matrix or frequency distribution. The generated estimated LLR table is input to the LLR converting unit 101.

The estimated LLR-table generating unit 105 can calculate an LLR value by adding a correction value larger than the preset 0 to the value of the frequency distribution. The following equation (7) is an example of a formula for computation of the LLR value that can be used in this case. In the equation (7), the correction value is set to 1; however, the correction value can be other than 1, so long as the correction value is larger than 0.

[Equation 7]

$$LLR(y) = \ln\left(\frac{(F(x=0, y)+1) / \sum_{y'}(F(x=0, y')+1)}{(F(x=1, y)+1) / \sum_{y'}(F(x=1, y')+1)}\right) \quad (7)$$

By adding the correction value, it can be avoided that division by 0 occurs when the frequency is 0. The method of avoiding division by 0 is not limited thereto and, for example, a method of performing computation by replacing a divisor by 1, when the devisor becomes 0, can be applied. Such a method of avoiding division by 0 can be applied not only to the present embodiment but also to the first to fourth embodiments.

While an example of using an absolute value of the a posteriori LLR as the reliability has been described above, the reliability is not limited thereto. For example, as in the first to third embodiments, the decoder 102 that outputs the estimated value k can be configured to output the reliability of the estimated value k further, and the estimated channel transition matrix aggregating unit 504 can be configured to use the reliability output from the decoder 102.

The reliability can be expressed by, for example, a binary flag of 0 and 1 (low reliability flag). For example, when the value thereof is 0, the low reliability flag represents that the reliability is high, and when the value is 1, the low reliability flag represents that the reliability is low. In this case, with respect to bits with the low reliability flag being 1, the estimated channel transition matrix aggregating unit 504 converts the scale value of the counter that count the frequency to a value equal to or smaller than the scale value of the counter with respect to bits with the low reliability flag being 0.

The reliability does not need to be a binary value indicating whether the reliability is high or low, and can be expressed by three or more values. For example, a flag having three values of 0=high reliability, 1=middle reliability, and 2=low reliability as the reliability can be used. In this case, the estimated channel transition matrix aggregating unit 504 aggregates the frequencies by using a scale value different from each other corresponding to the value of the flag. For example, with respect to bits with the flag being 1, the estimated channel transition matrix aggregating unit 504 converts the value of the counter that counts the frequency by using a scale value S1 to perform aggregation. With respect to bits with the flag being 2, the estimated channel transition matrix aggregating unit 504 converts the value of the counter that counts the frequency by using a scale value S2 (<S1) to perform aggregation.

When the absolute value of the a posteriori LLR is used as the reliability, the number of occurrences can be aggregated by using a scale value different according to a comparison result between the absolute value and two or more thresholds. When two thresholds of, for example, a threshold 1=2 and a threshold 2=4 are to be used, if the absolute value is larger than 2 and equal to or smaller than 4, the estimated channel transition matrix aggregating unit 504 converts the counter value by using the scale value S1 to perform aggregation. If the absolute value is equal to or smaller than 2, the estimated channel transition matrix aggregating unit 504 converts the counter value by using the scale value S2 (<S1) to perform aggregation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory; and
a memory controller configured to:
read data recorded in the non-volatile memory as a received value;
convert the received value read from the non-volatile memory to first likelihood information by using a first conversion table;
decode the first likelihood information;
output a first estimated value with respect to the received value, which is a decoding result obtained by the decoding, when decoding of the first likelihood information has succeeded;
aggregate number of occurrences of a pair of the received value and a second estimated value, when the decoding of the first likelihood information has failed, the second estimated value being generated based on a decoding result of the failed decoding; and
generate a second conversion table based on an aggregation result, when decoding of the first likelihood information has failed, wherein
when the memory controller generates the second conversion table, the memory controller converts the received value to second likelihood information by using the second conversion table, and decodes the second likelihood information.

2. The memory system according to claim 1, wherein
every time the decoding of the second likelihood information ha failed, the memory controller generates a new second conversion table based on a result of the failed decoding the aggregation result,
every time the memory controller generates the second conversion table, the memory controller converts the received value to the second likelihood information by using the second conversion table, and
every time the received value is converted to the second likelihood information, the memory controller decodes the second likelihood information.

3. The memory system according to claim 2, wherein the memory controller is configured to:
aggregate number of occurrences of a pair of the received value and the second estimated value, when the decoding of the first likelihood information or the second likelihood information has failed, and
generate the second conversion table based on the aggregation result.

4. The memory system according to claim 2, wherein the memory controller is configured to:
aggregate number of occurrences of a pair of the received value and the second estimated value, when the decoding of the first likelihood information or the second likelihood information has failed, wherein
output a posteriori probability information as a result of the decoding,
generate the second estimated value from a posteriori probability information indicating a value larger than a predetermined threshold, of t pieces of a posteriori probability information,
aggregate number of occurrences of a pair of the received value and the second estimated value with regard to the second estimated value with the a posteriori probability information indicating a value larger than the predetermined threshold, and
generate the second conversion table based on the aggregation result.

5. The memory system according to claim 1, wherein the memory controller is configured to:
outputs a posteriori probability information as a result of the decoding,
generate the second estimated value from a posteriori probability information indicating a value larger than a predetermined threshold, of pieces of a posteriori probability information,
aggregate number of occurrences of a pair of the received value and the second estimated value with regard to the second estimated value with the a posteriori probability information indicating a value larger than the predetermined threshold, and
generate the second conversion table based on the aggregation result.

6. The memory system according to claim 1, wherein the memory controller is configured to:
modify the second conversion table,
convert the received value to the second likelihood information by using the second conversion table after modification.

7. The memory system according to claim 1, wherein the memory controller is configured to convert a received value sequence configured by a predetermined number of the received values to a likelihood information sequence configured by a predetermined number of pieces of the first likelihood information or the second likelihood information, in unit of the received value sequence, and
the memory controller is configured to perform the decoding in unit of the likelihood information sequence.

8. The memory system according to claim 7, wherein the memory controller is configured to:
aggregate number of occurrences of a pair of the received value and the second estimated value obtained by decoding with respect to the likelihood information sequences, and
generate the second conversion table based on the aggregation result.

9. The memory system according to claim 1, wherein after the memory controller has performed generation of the second conversion table for a predetermined number of times, when the decoding of the second likelihood information has failed, memory controller outputs a decoding failure.

10. The memory system according to claim 1, wherein the first likelihood information and the second likelihood information are a log-likelihood ratio.

11. The memory system according to claim 1, wherein the data recorded in the non-volatile memory is data encoded by an error correction code that can be used in soft-decision decoding.

12. The memory system according to claim 1, wherein the memory controller is configured to:
aggregate the number of occurrence, by setting a first scale value of the number of occurrences of a pair having reliability of decoding lower than that of other pairs as a value equal to or smaller than a second scale value of the number of occurrences of other pairs, and
generate the second conversion table based on the aggregation result.

13. The memory system according to claim 12, wherein the memory controller is configured to output a decoding result obtained by the decoding and the reliability, and
the memory controller is configured to aggregate the number of occurrences, by setting the first scale value of number of occurrences of a pair having the output reliability, lower than that of other pairs as a value equal to or smaller than the second scale value.

14. The memory system according to claim 13, wherein
the reliability takes two or more values, and
the memory controller is configured to aggregate the number of occurrences by using the first scale value being different according to the two or more values.

15. The memory system according to claim 12, wherein
the memory controller is configured to the a posteriori probability information as a result of the decoding, and
the memory controller is configured to aggregate the number of occurrences, by setting the first scale value of the number of occurrences of a pair having the reliability, which is an absolute value of the a posteriori probability information, lower than that of other pairs as a value equal to or smaller than the second scale value.

16. The memory system according to claim 15, wherein
the memory controller is configured to aggregate the number of occurrences by using the first scale value, which is different according to a comparison result between the absolute value of the a posteriori probability information and two or more thresholds.

17. The memory system according to claim 12, wherein
memory controller is configured to aggregate a value obtained by adding a correction value larger than 0 to respective number of occurrences of the pair.

18. The memory system according to claim 12, wherein
the second scale value is 1, and
the first scale value is equal to or smaller than 1.

* * * * *